United States Patent
Kim

(10) Patent No.: US 9,157,600 B2
(45) Date of Patent: Oct. 13, 2015

(54) LIGHT-EMITTING DEVICE AND LIGHT-EMITTING SYSTEM INCLUDING THE SAME

(71) Applicant: SAMSUNG ELECTRONICS CO., LTD., Suwon-si, Gyeonggi-do (KR)

(72) Inventor: Yu-Sik Kim, Yangcheon-gu (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/103,562

(22) Filed: Dec. 11, 2013

(65) Prior Publication Data

US 2014/0098533 A1    Apr. 10, 2014

Related U.S. Application Data

(62) Division of application No. 13/118,924, filed on May 31, 2011, now Pat. No. 8,628,368.

(30) Foreign Application Priority Data

May 28, 2010 (KR) .......................... 10-2010-0050384

(51) Int. Cl.
     *H01L 33/00* (2010.01)
     *H01L 33/58* (2010.01)
     (Continued)

(52) U.S. Cl.
     CPC ............. *F21V 5/007* (2013.01); *F21S 48/1154* (2013.01); *F21S 48/1225* (2013.01); *F21S 48/215* (2013.01); *F21S 48/2212* (2013.01); *H01L 25/0753* (2013.01); *H01L 25/167* (2013.01); *H01L 33/56* (2013.01); *F21K 9/00* (2013.01); *F21S 8/08* (2013.01); *F21W 2131/103* (2013.01); *F21Y 2101/02* (2013.01); *F21Y 2105/001* (2013.01); *H01L 33/54* (2013.01); *H01L 2224/48091* (2013.01); *H01L 2224/73265* (2013.01); *H01L 2924/1815* (2013.01); *H01L 2924/3025* (2013.01)

(58) Field of Classification Search
CPC .... H01L 25/075–25/0756; H01L 33/52–33/60
USPC .............................. 313/498–501; 257/98–100
See application file for complete search history.

(56) References Cited

U.S. PATENT DOCUMENTS 6,432,328 B2    8/2002    Hamanaka et al.
6,531,328 B1    3/2003    Chen
(Continued)

FOREIGN PATENT DOCUMENTS

JP      8-166502 A    6/1996
JP      2004235337 A *    8/2004
(Continued)

*Primary Examiner* — Mariceli Santiago
(74) *Attorney, Agent, or Firm* — Lee & Morse, P.C.

(57) ABSTRACT

Provided are a light-emitting device having improved light dispersion efficiency, a light-emitting system including the same, and fabricating methods of the light-emitting device and the light-emitting system. The light-emitting device includes one or more light-emitting elements arranged on first surface of a substrate, an insulation film formed on the first surface of a substrate so as to cover the one or more light-emitting elements, and a plurality of uneven patterns formed on the insulation film formed on each of the one or more light-emitting elements so as to be spaced apart from each other, wherein the plurality of uneven patterns are all convex patterns or concave patterns and each of the plurality of uneven patterns has a curved cross-sectional shape.

20 Claims, 22 Drawing Sheets

(51) Int. Cl.

| | |
|---|---|
| *H01L 33/52* | (2010.01) |
| *F21V 5/00* | (2015.01) |
| *H01L 25/075* | (2006.01) |
| *H01L 25/16* | (2006.01) |
| *H01L 33/56* | (2010.01) |
| *F21S 8/10* | (2006.01) |
| *F21K 99/00* | (2010.01) |
| *F21S 8/08* | (2006.01) |
| *F21W 131/103* | (2006.01) |
| *F21Y 101/02* | (2006.01) |
| *F21Y 105/00* | (2006.01) |
| *H01L 33/54* | (2010.01) |

(56) References Cited

U.S. PATENT DOCUMENTS

| | | | |
|---|---|---|---|
| 6,610,598 | B2 | 8/2003 | Chen |
| 7,042,022 | B2* | 5/2006 | Han et al. .................. 257/99 |
| 7,696,525 | B2 | 4/2010 | Kim et al. |
| 2007/0196939 | A1* | 8/2007 | Park et al. .................. 438/22 |
| 2010/0295089 | A1* | 11/2010 | Kim et al. .................. 257/99 |

FOREIGN PATENT DOCUMENTS

| | | |
|---|---|---|
| JP | 2005-166941 A | 6/2005 |
| KR | 10-2008-0029472 A | 4/2008 |
| KR | 10-2008-0083832 A | 9/2008 |

\* cited by examiner

LIGHT-EMITTING DEVICE AND LIGHT-EMITTING SYSTEM INCLUDING THE SAME

CROSS-REFERENCE TO RELATED APPLICATION

This is a divisional application based on pending application Ser. No. 13/118,924, filed May 31, 2011, the entire contents of which is hereby incorporated by reference.

This application claims priority from Korean Patent Application No. 10-2010-0050384 filed on May 28, 2010 in the Korean Intellectual Property Office, and all the benefits accruing therefrom under 35 U.S.C. 119, the contents of which in its entirety are herein incorporated by reference.

BACKGROUND

1. Field

Embodiments relate to a light-emitting device, a light-emitting system including the same, and a fabricating method thereof, and more particularly to a light-emitting device having improved light dispersion efficiency while having a reduced manufacturing cost, a light-emitting system including the same, and fabricating methods of the light-emitting device and the light-emitting system.

2. Description of the Related Art

Light-emitting elements, such as LEDs (light-emitting diodes), emit light by coupling between electrons and holes. In general, the light-emitting element has low power consumption characteristics, a long life span, a sufficiently small size to be provided in a small space, and high shock resistance.

In a light emitting diode (LED) device, light-emitting elements are mounted on a substrate, and a transparent resin layer covers top surfaces of the light-emitting elements to protect the light-emitting elements while allowing light emitted from the light-emitting elements to be easily extracted to the outside. In this case, one transparent resin layer is provided in a convex dome shape covering one light-emitting element.

LEDs are used for illumination or display. LEDs used for illumination are generally divided LEDs for indoor/outdoor illumination, which require uniform dispersion over a wide area, and LEDs for transportation, which require linearity of light. It is desirable to use an LED suited for the purpose.

SUMMARY

One or more embodiments provide a light-emitting device having improved light dispersion efficiency and/or a reduced manufacturing cost as compared to conventional devices.

One or more embodiments provide a light-emitting system including the light-emitting device.

One or more embodiments provide a method of fabricating a light-emitting device having improved light dispersion efficiency and/or a reduced manufacturing cost as compared to conventional devices.

One or more embodiments provide a method of fabricating a light-emitting system including the method of fabricating a light-emitting device having improved light dispersion efficiency while a reduced manufacturing cost.

One or more embodiments may provide a light-emitting device, including one or more light-emitting elements arranged on a first surface of a substrate, an insulation film on the first surface of the substrate, the insulation film covering the one or more light-emitting elements, and a plurality of uneven patterns on the insulation film, the uneven patterns respectively overlapping respective ones of the of the one or more light-emitting elements, the plurality of uneven patterns being spaced apart from each other, wherein the plurality of uneven patterns are all convex patterns or all concave patterns and each of the plurality of uneven patterns has a curved cross-sectional shape.

The first surface of the substrate may be substantially planar as a whole.

Lateral surfaces of the insulation film may be exposed. The plurality of uneven patterns may be on a surface of the insulation film and the surface of the insulation film may include a plurality of the uneven patterns spaced apart from each other and first planar connection patterns connecting the uneven patterns to each other.

Each of the uneven patterns may be shaped of a hemisphere or a semicircular cylinder.

The plurality of uneven patterns may be one of a dot type, a stripe type and a mesh type.

A maximum diameter of each of the uneven patterns may be equal to and/or in the range of approximately 30 µm to approximately 100 µm.

A maximum height or depth of each of the uneven patterns may be equal to and/or in the range of approximately 30 µm to approximately 50 µm.

A width of two adjacent spaced-apart uneven patterns of the plurality of uneven patterns may be equal to and/or within a range of approximately 5 µm to approximately 20 µm.

The device may include phosphor locally distributed at a lower portion of the insulation film or uniformly distributed on the surface of the insulation film.

The device may include a zener diode formed on a second surface of the substrate, the second surface being opposite the first surface.

The substrate may include a plurality of light-emitting device mount regions and a plurality of isolation regions disposed between two adjacent ones of the plurality of light-emitting device mount regions, one or more of the light-emitting elements may be disposed for each of the plurality of light-emitting device mount regions, and a plurality of uneven patterns may be disposed for each of the plurality of light-emitting device mount regions.

The plurality of uneven patterns may be formed on a surface of the insulation film, the surface of the insulation film disposed on the light-emitting device mount regions may include a plurality of the uneven patterns spaced apart from each other and first planar connection patterns connecting the uneven patterns to each other, and the surface of the insulation film disposed on the plurality of isolation regions includes second planar connection patterns only.

The device may include a one-surface electrode formed on the first surface of the substrate and an opposite-surface electrode formed on second surface of the substrate and connected to the one-surface electrode, and the light-emitting elements may be arranged on the one-surface electrode in any one of a flip chip type, a vertical type and a lateral type orientation.

The insulation film may be located on the light-emitting device mount regions only, excluding the isolation regions.

A light-emitting system may include a light-emitting device including one or more light-emitting elements arranged on a first surface of a substrate, an insulation film on the first surface of the substrate, the insulation film covering the one or more light-emitting elements, and a plurality of uneven patterns on the insulation film, the uneven patterns respectively overlapping respective ones of the of the one or more light-emitting elements, the plurality of uneven patterns being spaced apart from each other, wherein the plurality of uneven patterns are all convex patterns or all concave patterns and each of the plurality of uneven patterns has a curved cross-sectional shape.

One or more embodiments may provide a method of fabricating a light-emitting device, the method including providing one or more light-emitting elements on a first surface of a substrate, forming an insulation film on the first surface of a substrate, the insulation film covering the one or more light-emitting elements, and forming a plurality of uneven patterns formed on the insulation film on each of the one or more light-emitting elements, the plurality of uneven patterns being spaced apart from each other, wherein the plurality of uneven patterns are all convex patterns or all concave patterns and each of the plurality of uneven patterns has a curved cross-sectional shape.

Forming the plurality of uneven patterns may include forming the plurality of uneven patterns by etching the insulation film.

Forming the plurality of uneven patterns may include forming a plurality of photoresist uneven patterns on the insulation film having shapes corresponding to those of the plurality of uneven patterns, and dry etching the plurality of photoresist uneven patterns and the insulation film.

Forming the plurality of photoresist uneven patterns may include forming a photoresist film on the insulation film, and compressing an imprint substrate including a plurality of imprinted uneven patterns on the photoresist film to then transcribe the plurality of photoresist uneven patterns in complement with the plurality of imprinted uneven patterns onto the photoresist film.

The substrate may include a plurality of light-emitting device mount regions and a plurality of isolation regions disposed between two adjacent ones of the plurality of light-emitting device mount regions, one or more of the light-emitting elements is disposed for each of the plurality of light-emitting device mount regions, and a plurality of uneven patterns are disposed for each of the plurality of light-emitting device mount regions.

The method may include forming a via hole that passes through the substrate to define the plurality of light-emitting device mount regions before the one or more of the light-emitting elements are disposed, and forming a one-surface electrode formed on the first surface of the substrate and an opposite-surface electrode formed on a second surface, opposite the first surface, of the substrate and connected to the one-surface electrode, wherein the light-emitting elements are arranged on the one-surface electrode in any one of a flip chip type, a vertical type and a lateral type orientation.

One or more embodiments may provide a method of fabricating a light-emitting device, the method including providing a substrate having light-emitting elements, an insulation film covering the light-emitting elements, and a photoresist film covering the insulation film sequentially formed on a first surface, and an imprint substrate having a plurality of imprinted uneven patterns formed thereon, compressing the imprint substrate on the photoresist film to then transcribe the plurality of photoresist uneven patterns in pair with the plurality of imprinted uneven patterns to the photoresist film, and dry etching the plurality of photoresist uneven patterns and the insulation film to form a plurality of uneven patterns in pair with the plurality of imprinted uneven patterns on the insulation film disposed on the light-emitting elements.

The plurality of uneven patterns may be concave patterns, the plurality of imprinted uneven patterns may be convex patterns complementary with the concave patterns of the uneven patterns, and forming of the plurality of imprinted uneven patterns includes forming the plurality of imprinted uneven patterns by etching an imprinting insulation film formed on the imprint substrate.

Forming the plurality of imprinted uneven patterns may include forming the imprinting insulation film on the imprint substrate, forming an imprinting photoresist film on the imprinting insulation film, forming a plurality of imprinting photoresist uneven patterns by patterning the imprinting photoresist, and forming the plurality of imprinted uneven patterns corresponding to the plurality of imprinting photoresist uneven patterns by dry etching the imprinting photoresist uneven patterns and the imprinting insulation film.

The plurality of uneven patterns may be concave patterns, the plurality of imprinted uneven patterns may be convex patterns in complement with of the concave patterns of the uneven patterns, and forming the plurality of imprinted uneven patterns may include forming the plurality of imprinted uneven patterns by electroplating an imprinting metal on an imprint substrate having imprinted uneven patterns corresponding to the plurality of uneven patterns.

A seed metal layer may be formed on the imprint substrate having the imprinted patterns before electroplating the imprinting metal to a uniform thickness, and the imprinting metal is electroplated on the seed metal layer.

The plurality of uneven patterns may be formed on a surface of the insulation film so as to be spaced apart from each other, and the surface of the insulation film includes the plurality of the uneven patterns spaced apart from each other and first planar connection patterns connecting the plurality of uneven patterns to each other.

The plurality of uneven patterns may be all convex patterns or all concave patterns and each of the plurality of uneven patterns may have a curved cross-sectional shape.

One or more embodiments may provide a method of fabricating a light-emitting system.

One or more embodiments may provide a light-emitting device, including one or more one light-emitting elements arranged on a first surface of a substrate, and an insulation film on the first surface of the substrate, the insulation film covering the one or more light-emitting elements and including one or more light-controlling patterns overlapping the one or more light-emitting elements, wherein the light-controlling patterns include all curved-concave patterns or all curved-convex patterns.

Other than the light-controlling patterns, the insulation film may be planar.

Each of the light-emitting elements may overlap a respective group of the light-controlling patterns.

The groups of the light-controlling patterns may be spaced apart from each other.

The insulation film may be planar between the groups of the light-controlling patterns.

For each of the light emitting elements, each of the groups of light-controlling patterns may include a plurality of the curved-concave patterns or a plurality of the curved-convex patterns, and the respective ones of the plurality of curved-concave or curved-convex patterns within each group are spaced apart from each other.

The insulation layer may be planar between each of the plurality of curved-concave or curved-convex patterns in each of the groups of the light-controlling patterns.

The substrate may be planar.

The substrate may include via holes and/or grooves extending partially and/or completely between the first surface of the substrate and a second surface of the substrate, opposite the first surface.

BRIEF DESCRIPTION OF THE DRAWINGS

Features will become more apparent to those of ordinary skill in the art by describing in detail exemplary embodiments with reference to the attached drawings, in which.

DETAILED DESCRIPTION

Figure 1:
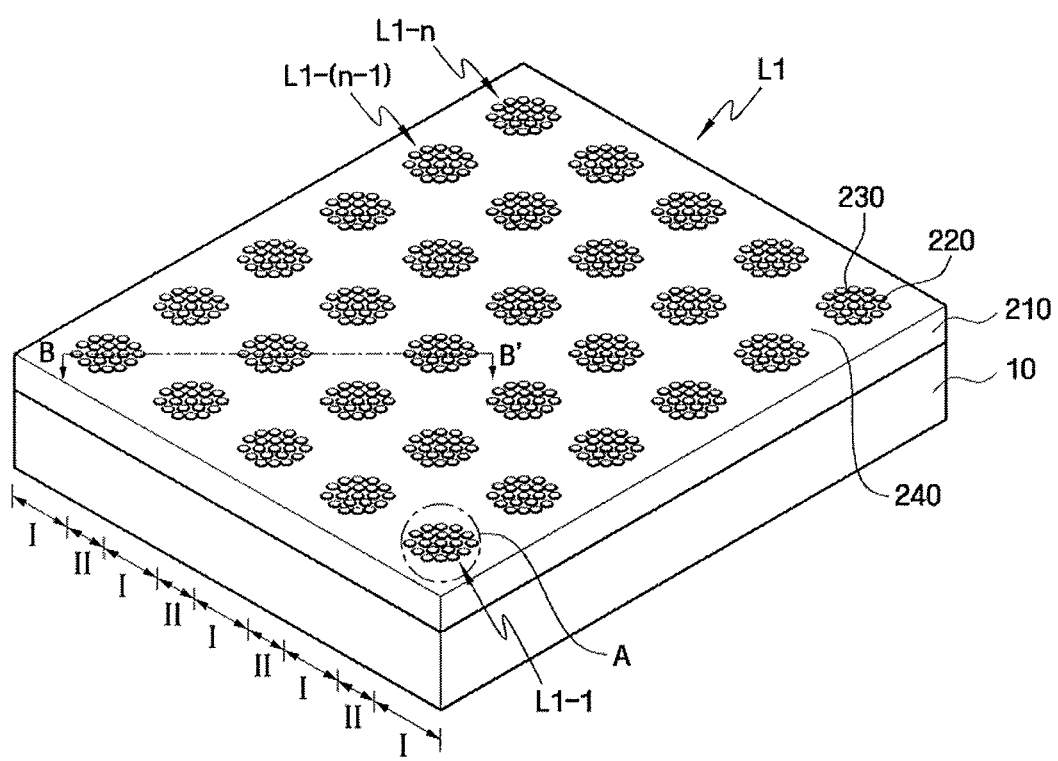
FIG. 1 illustrates a perspective view of an exemplary embodiment of a light-emitting device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout the specification.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
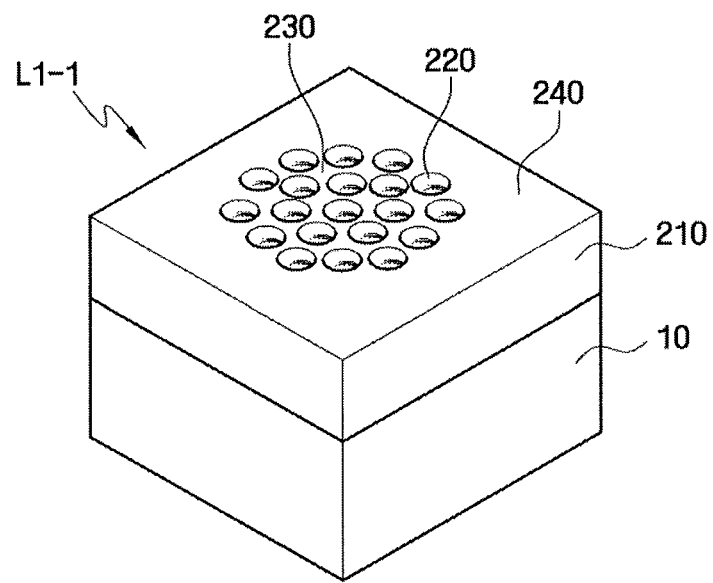
FIG. 2 illustrates an enlarged perspective view of an exemplary embodiment of a portion 'A' of the light-emitting device of FIG. 1.
Figure 3:
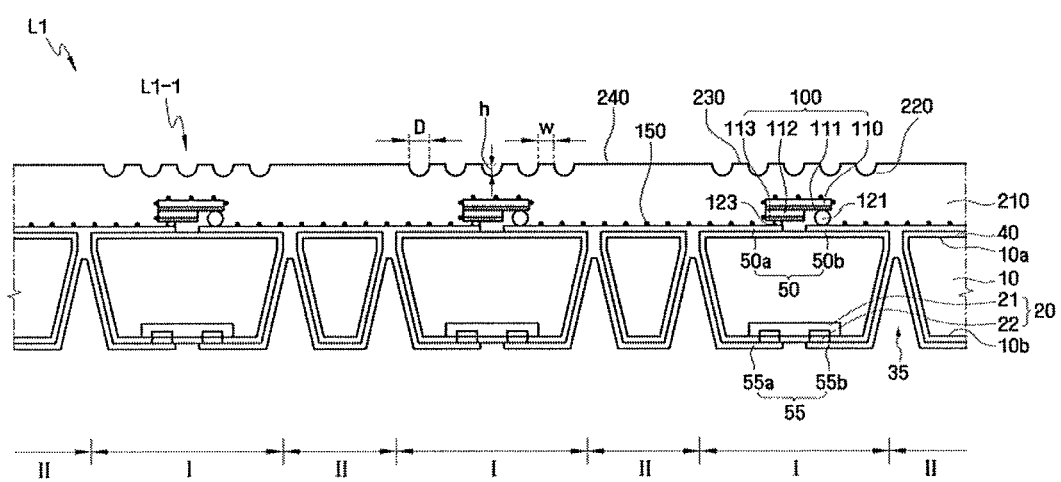
FIG. 3 illustrates a cross-sectional view of an exemplary embodiment of the light-emitting device of FIG. 1, taken along the line B-B' of FIG. 1.

An exemplary embodiment of a light-emitting device L1 will be described with reference to FIGS. 1 through 3. More particularly, FIG. 1 illustrates a perspective view of the light-emitting device L1. FIG. 2 illustrates an enlarged perspective view of an exemplary embodiment of a portion 'A' of the light-emitting device L1 of FIG. 1. FIG. 3 illustrates a cross-sectional view of the light-emitting device L1 of FIG. 1, taken along the line B-B' of FIG. 1.

Referring to FIGS. 1 through 3, the light emitting device L1 may include a substrate 10, a first insulation film 40, a second insulation film 210 including one or more uneven patterns 220, first planar connection patterns 230, and second planar connection patterns 240, one or more grooves 35, one or more light emitting elements 100, one or more zener diodes 20, one or more front-surface electrodes 50, and one or more back-surface electrodes 55.

In one or more embodiments, the light-emitting device L1 may include a plurality of light emitting modules L1-1 to L1-$n$. More particularly, each of the light emitting modules L1-1 to L1-$n$ may include, e.g., one of the light-emitting elements 100, one of the zener diodes 20, one of the front-surface electrodes 50, one of the back-surface electrodes 55, a respective portion of the first insulation film 40, and a respective portion of the second insulation film 210 including at least one of the uneven patterns 220.

The light emitting elements 100 may be arranged on first surface 10a of the substrate 10. The second insulation film 210 may cover the light-emitting elements 100. The uneven patterns 220 on the second insulation film 210 may respectively overlap the light-emitting elements 100. More particularly, e.g., each of the uneven patterns 220 of the second insulation film 210 may overlap respective ones of the light-emitting elements 100. The first planar connection patterns 230 may extend between respective non-planar or uneven portions of the uneven patterns 220.

The substrate 10 may include a plurality of light-emitting element mount regions (I) and isolation regions (II) disposed between two respective adjacent regions of the plurality of light-emitting element mount regions I. In one or more embodiments, a single substrate 10 may be employed in connection with a plurality of the light-emitting modules L1-1 to L1-$n$. Accordingly, when describing such embodiments, when reference is made to the substrate 10, it may also refer to a respective one of the light-emitting element mount regions I of the substrate 10 corresponding to one of the light emitting modules L1-1 to L1-$n$.

The substrate 10 may be, for example, a sapphire substrate, a silicon (Si) substrate, a silicon carbide (SiC) substrate, a sapphire substrate having gallium nitride formed thereon, a silicon substrate having gallium nitride formed thereon, a silicon carbide substrate having gallium nitride formed thereon, and so on.

The substrate 10 may be an undoped substrate, i.e., without doped impurities.

The substrate 10 may include a first surface 10a and second surface 10b that is opposite to the first surface. The first surface 10a of the substrate 10, on which the light-emitting element 100 is mounted, may be substantially planar as a whole. When describing the substrate 10 as being substantially planar as a whole, the description is meant to exclude a substrate having an extension or protrusion portion thereon, e.g., a protrusion forming a groove thereon. In one or more embodiments, while the substrate 10 is described as being substantially planar as a whole, the substrate 10 may include, e.g., one or more via holes (30 of FIG. 14) formed between the first surface 10a and the second surface 10b of the substrate 10 or the front-surface electrode 50 formed on the first surface of the substrate 10.

Referring to FIGS. 1-3, for each of the light-emitting modules L1-1 to L1-$n$, the respective zener diode 20 may be embedded at the opposite side of the substrate 10, i.e., side of substrate 10 opposing a side on which light-emitting element 100 is arranged. Each of the zener diodes 20 may include a first-type semiconductor region 21 and a second-type semiconductor region 22 formed in the substrate 10. The first-type semiconductor region 21 may include a first-type impurity, for example, P-type impurity. The first-type semiconductor region 21 may overlap both a first back-surface electrode 55a and a second back-surface electrode 55b. The second-type semiconductor region 22 may include a second-type impurity having an opposite conductivity type to the first-type impurity. The second-type semiconductor region 22 may be formed on the first-type semiconductor region 21 so as to contact the first-type semiconductor region 21. The second-type impurity may be, for example, N-type impurity. Two or more of the second-type semiconductor regions 22 may be formed to overlap the first back-surface electrode 55a and the second back-surface electrode 55b, respectively. The first-type semiconductor region 21 and the second-type semiconductor region 22 may form a PN junction and constitute the zener diode 20.

In one or more embodiments, the zener diode 20 may be formed by ion-implanting first-type impurity and second-type impurity into the substrate 10 that is not doped with impurity, thereby easily adjusting concentrations of the respective impurities. In one or more embodiments, the first-type impurity may be formed with a relatively low concentration, and the second-type impurity may be formed with a relatively high concentration. More particularly, e.g., the concentration of the first-type impurity may be greater than or equal to $5\times10^{16}/cm^3$ and less than or equal to $1\times10^{18}\,cm^3$, and the concentration of the second-type impurity may be higher than the concentration of the first-type impurity.

When an over-voltage is applied to the light-emitting element 100, the zener diode 20 prevents the light-emitting element 100 from being damaged by creating a by-pass current due to static electricity, etc.

The one or more grooves 35 may be formed in the substrate 10. The grooves 35 may have a pyramid shape, e.g., a cross section tapering from the second surface 10b toward the first surface 10a of the substrate 10. The cross-sectional shape of the grooves 35 may be "inverted V-shaped." One or more of the grooves 35 may be formed between adjacent ones of the plurality of light-emitting element mount regions I. In the exemplary embodiment of FIGS. 1-3, two of the grooves 35 are formed between two adjacent ones of the plurality of light-emitting element mount regions I, but embodiments are not limited thereto. For example, in one or more embodiments, a via hole 30 may be respectively formed at an end of one or more of the grooves 35.

The first insulation film 40 may be formed on the substrate 10. More particularly, e.g., the first insulation film 40 may be formed on the first and the second surfaces 10a, 10b, of the substrate 10 and on inner surfaces of the grooves 35 and/or the via hole 30. The insulation film 40 may include a plurality of portions, which may be spaced apart from each other. More particularly, e.g., referring to FIG. 3, respective portions of the insulation film corresponding to respective ones of the light-emitting modules or light-emitting element mount regions I may be spaced apart from each other.

Referring still to FIGS. 1-3, the front-surface electrode 50 may be formed on the first surface 10a of the substrate 10. The back-surface electrode 55 may be formed on the second surface 10b of the substrate 10.

The front-surface electrode 50 may include a first front-surface electrode 50a and a second front-surface electrode 50b spaced apart from each other. The back-surface electrode 55 may include a first back-surface electrode 55a and a second back-surface electrode 55b spaced apart from each other. The back-surface electrodes 55a and 55b formed on the second surface 10b of the substrate 10 may contact the front-surface electrodes 50a and 50b through respective ones of the via holes 30. More particularly, in one or more embodiments, the first back-surface electrode 55a may directly contact the first front-surface electrode 50a, and the second back-surface electrode 55b may directly contact the second front-surface electrode 50b, respectively. That is, the first front-surface electrode 50a and the first back-surface electrode 55a may be an extension of each other by way of the respective via hole 30 through the substrate 10.

The front-surface electrode 50 and the back-surface electrode 55 may include a single layer or multiple layers. The one or more layers of the front-surface electrode 50 and/or the one or more layers of the back-surface electrode 55 may include a material that is highly conductive and adhesive with respect to the first insulation film 40, for example, Ti, Pt, Au, Cr, Ni, Cu, or Ag.

For each of the light-emitting modules L1-1 to L1-n, the light-emitting element 100 may be mounted on the front-surface electrodes 50a and 50b on each of the plurality of light-emitting element mount regions I. At least one light-emitting element 100 may be formed on each of the plurality of light-emitting element mount regions I. Alternatively, two or more of the light-emitting elements 100 may be mounted on one of the plurality of light-emitting element mount regions I. In the following description, the invention will be described with regard to an exemplary case where one light-emitting element 100 is mounted on each of the plurality of light-emitting element mount regions I. In one or more embodiments, e.g., as illustrated in FIGS. 1 and 3, the plurality of light emitting elements 100 may be arranged in an array.

Referring to FIG. 3, each the light-emitting elements 100 may include a first conductive pattern 111 of a first conductivity type, a light-emitting pattern 112, and a second conductive pattern 113 of a second conductivity type. The first conductive pattern 111, the light-emitting pattern 112, and the second conductive pattern 113 may be arranged on a substrate 110.

Exemplary embodiments of the respective layers will now be described in detail. The first conductive pattern 111 may be of a first conductivity type (for example, n type). The second conductive pattern 113 may be of a second conductivity type (for example, p type). Embodiments are not limited thereto. For example, in one or more embodiments, the first conductive pattern 111 may be of p type, and the second conductive pattern 113 may be of n type.

In the light-emitting pattern 112, carriers, e.g., electrons, of the first conductive pattern 111 may be coupled to carriers, e.g., holes, of the second conductive pattern 113 to emit light.

Although not specifically shown in the drawings, the light-emitting pattern 112 may include a well layer and a barrier layer. Since the well layer has a band gap that is smaller than that of the barrier layer, the carriers (electrons and holes) may be collected and coupled in the well layer. The light-emitting pattern 112 may be classified as a single quantum well (SQW) structure or a multiple quantum well (MQW) structure according to the number of well layers. The single quantum well structure includes one well layer, and the multiple quantum well structure includes multiple well layers. In one or more embodiments, to adjust emission characteristics, at least one of the well layer and the barrier layer may be doped with at least one of B, P, Si, Mg, Zn, Se, and Al.

The first chip electrode (not shown) may be formed on the first conductive pattern 111. The first chip electrode may be made of a transparent or opaque metal. Specifically, the first chip electrode may include at least one of silver (Ag), aluminum (Al), ITO (indium tin oxide), copper (Cu), nickel (Ni), chrome (Cr), gold (Au), titanium (Ti), platinum (Pt), (V), tungsten (W), and molybdenum (Mo).

In addition, a second chip electrode (not shown) may be formed on the second conductive pattern 113. The second chip electrode may be made of a highly reflective material, for example, silver (Ag) and/or aluminum (Al), etc.

In one or more embodiments, the light-emitting elements 100 may be mounted on the front-surface electrode 50 formed on the substrate 10 in a flip chip type manner. The light-emitting elements 100 may be mounted on the substrate 10 using solders 121 and 123. The solders 121 and 123 may be formed using, for example, AgSn, PbSn, or AuSn. The solder 121 connected to the first conductive pattern 111 may be connected to the second front-surface electrode 50b. The solder 123 connected to the second conductive pattern 113 may be connected to the first front-surface electrode 50a. Embodiments are not limited thereto. For example, the first conductive pattern 111 and the second conductive pattern 113 may be alternatively connected to the front-surface electrode 50 for each light-emitting element 100. The thus formed light-emitting element 100 may be one of a blue light-emitting element, a red light-emitting element, and a green light-emitting element.

The second insulation film 210 may be formed on the first surface 10a of the substrate 10 and may cover one or more of the light-emitting elements 100. Since the substrate 10 is substantially planar as a whole, there is no upwardly protruding structure on the first surface 10a of the substrate 10. Thus, lateral surfaces of the second insulation film 210 are exposed to the outside. The second insulation film 210 may include a viscous material so that it may not flow down when coated on the substrate 10. For example, the second insulation film 210 may include a silicone resin. The second insulation film 210 may protect the light-emitting element 100. The uneven patterns 220 may be formed on the second insulation film 210.

Meanwhile, the second insulation film 210 may include a phosphor 150. Referring to FIG. 3, in one or more embodiments, the phosphor 150 may be precipitated and then locally distributed at a lower portion of the second insulation film 210. Since the phosphor 150 is disposed to cover top and lateral surfaces of the light-emitting element 100 and the first surface 10a, e.g., top surface, of the substrate 10, light emitted from the light-emitting element 100 may be emitted to the air via the phosphor 150.

Here, the phosphor 150 may include a red phosphor that partially wavelength-converts blue light to then generate red light, a yellow phosphor that partially wavelength-converts blue light to then generate yellow light, and a green phosphor that partially wavelength-converts blue light to then generate green light.

For example, the phosphor 150 may include one or more of a nitride-based phosphor or an oxynitride-based phosphor that is mainly activated by a lanthanoid element, such as Eu or Ce; an alkaline earth element halogen apatite phosphor, an alkaline earth metal element boride halogen phosphor, an alkaline earth metal element aluminate phosphor, alkaline earth element silicate, alkaline earth element sulfide, alkali earth element thiogallate, alkaline earth element silicon nitride, and germanate that are mainly activated by a lanthanoid element, such as Eu, or a transition metal element, such as Mn; rare earth aluminate and rare earth silicate that are mainly activated by a lanthanoid element, such as Ce; and an organic compound and an organic complex that are mainly activated by a lanthanoid element, such as Eu. Specifically, while such phosphors may be used, embodiments are not limited to thereto.

The nitride-based phosphors that are mainly activated by a lanthanoid element, such as Eu or Ce include $M_2Si_5N_8$:Eu (M is at least one element selected from the group consisting of Sr, Ca, Ba, Mg, and Zn) may be employed. In addition to $M_2Si_5N_8$:Eu, $MSi_7N_{10}$:Eu, $M_{1.8}Si_5O_{0.2}N_8$:Eu, $M_{0.9}Si_7O_{0.1}N_{10}$:Eu (M is at least one element selected from the group consisting of Sr, Ca, Ba, Mg, and Zn) are also included.

The oxynitride-based phosphors mainly activated by a lanthanoid element, such as Eu or Ce, include $MSi_2O_2N_2$:Eu (M is at least one element selected from the group consisting of Sr, Ca, Ba, Mg, and Zn) may be employed.

The alkaline earth element halogen apatite phosphors mainly activated by a lanthanoid element, such as Eu, or a transition metal element, such as Mn, may be employed and may include $M_5(PO_4)_3X$:R (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element boride halogen phosphors may be employed and may include $M_2B_5O_9X$:R (M is at least one element selected from the group consisting of Sr, Ca, Ba, Mg, and Zn, X is at least one element selected from the group consisting of F, Cl, Br, and I, and R is at least one element selected from the group consisting of Eu, Mn, and a combination of Eu and Mn).

The alkaline earth metal element aluminate phosphors include $SrAl_2O_4$:R, $Sr_4Al_{14}O_{25}$:R, $CaAl_2O_4$:R, $BaMg_2Al_{16}O_{27}$:R, and $BaMg_2Al_{16}O_{12}$:R, $BaMgAl_{10}O_{17}$:R (R is at least one element selected from the group consisting of Eu, Mn, and a combination of Eu and Mn) may be employed.

The alkaline earth sulfide-based phosphors may be employed and may include, for example, $La_2O_2S$:Eu, $Y_2O_2S$:Eu, $Gd_2O_2S$:Eu, etc.

The rare earth aluminate phosphors mainly activated by a lanthanoid element, such as Ce, may be employed and may include YAG phosphors having the compositions of $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, $(Y, Gd)_3(Al, Ga)_5O_{12}$:Ce. The rare earth aluminate phosphors also include $Tb_3Al_5O_{12}$:Ce, $Lu_3Al_5O_{12}$:Ce in which a part or the whole of Y is substituted with, for example, Tb or Lu.

The alkaline earth element silicate phosphor may include silicate, and a representative example thereof is $(SrBa)_2SiO_4$:Eu.

Other phosphors include ZnS:Eu, $Zn_2GeO_4$:Mn, $MGa_2S_4$:Eu (M is at least one element selected from the group consisting of Sr, Ca, Ba, Mg, and Zn, and X is at least one element selected from the group consisting of F, Cl, Br and I).

The above-mentioned phosphors may include at least one element selected from the group consisting of Tb, Cu, Ag, Au, Cr, Nd, Dy, Co, Ni, and Ti, instead of or in addition to Eu, if necessary.

Other phosphors having the same performance and effect as described above may also be used.

Referring still to FIGS. 1-3, the plurality of uneven patterns 220 may be formed in the second insulation film 210 disposed on the light-emitting device mount regions I. In detail, the plurality of uneven patterns 220 may be formed on a surface 210a_I of the second insulation film 210. The plurality of uneven patterns 220 may be spaced apart from each other. Accordingly, the surface 210a_I of the second insulation film 210 disposed on each of the light-emitting device mount regions I may include the first planar connection patterns 230 that connect the plurality of spaced-apart uneven patterns 220 to each other. A surface 210a_II of the second insulation film 210 disposed on each of the isolation regions II may not include the uneven patterns 220 and may only include the second planar connection patterns 240.

In order to maximize light dispersion efficiency, in one or more embodiments, the plurality of uneven patterns 220 may all be concave patterns. More particularly, each of the uneven patterns 220 may have a curved cross-section. In detail, each of the plurality of uneven patterns 220 of this embodiment may have a hemispherical shape. The plurality of uneven patterns 220 may be arranged in a dot type manner. In one or more embodiments in which all of the plurality of uneven patterns 220 are concave patterns, the dispersion efficiency of the light emitted from the light-emitting element 100 may be improved.

In one or more embodiments, each of the uneven patterns 220 may have a maximum diameter D in the range of approximately 30 μm to approximately 100 μm. A maximum depth h of each of the uneven patterns 220 may be in the range of approximately 30 μm to approximately 100 μm. The plurality of uneven patterns 220 may be formed to have substantially the same diameter D and depth h. Light dispersion efficiency characteristics may be advantageous if the maximum diameter D and the maximum depth h of each of the uneven patterns 220 are equal to or with the range of approximately 30 μm to approximately 100 μm.

A width w of two adjacent spaced-apart uneven patterns of the plurality of uneven patterns 220 may be in the range of approximately 5 μm to approximately 20 μm. Due to a limit in photoresist resolution, it may be difficult to make the width w of the two adjacent spaced-apart uneven patterns 220 smaller than 5 μm. Meanwhile, if the width w of the two adjacent spaced-apart uneven patterns 220 is greater than 20 μm, the number of uneven patterns 220 disposed on one light-emitting element 100 is reduced, which may lower the light dispersion efficiency.

According to the exemplary embodiment of FIGS. 1-3, since the uneven patterns 220 include only concave patterns, the light dispersion efficiency may be improved. A light-emitting device, e.g., the light emitting device L1 of FIGS. 1-3, including uneven patterns 220 including only concave patterns may be employed for indoor/outdoor illumination, which requires uniform dispersion.

In addition, since the second insulation film 210 of this embodiment is formed over the light-emitting mount regions (I) and the isolation regions (II) of the substrate 10, e.g., the second insulation film 210 is disposed on the entire surface of the substrate 10 including light-emitting element mount regions (I) and isolation regions (II), a separate process for patterning the second insulation film 210 is not required, thereby simplifying the overall fabrication process.

An exemplary embodiment of a fabricating method of the light-emitting device L1 will be described in detail with reference to FIGS. 4 through 19. Like reference numerals are employed to describe like elements throughout the specification. Thus, the description of like elements may be abbreviated and/or not repeated. In general, in the exemplary embodiment described in connection with FIGS. 1-19, imprinted uneven patterns of an imprint substrate may be compressed on a photoresist film, and insulation films of the photoresist pattern and the substrate may be etched to then form concave uneven patterns in the light-emitting device L1.

Figure 4:
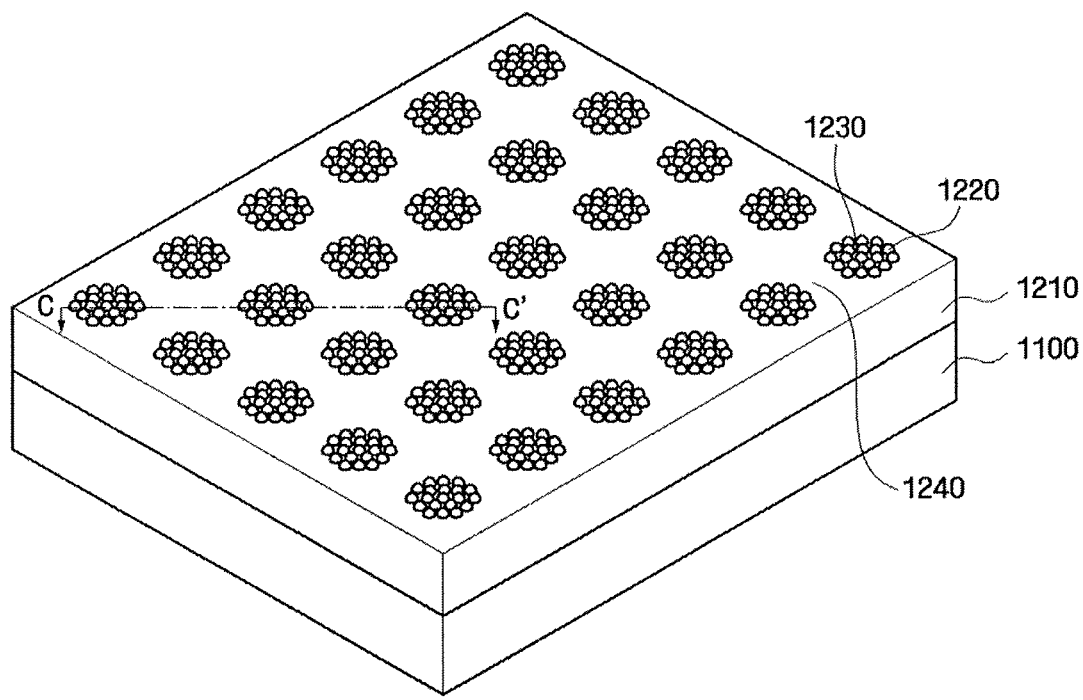
FIG. 4 illustrates a perspective view of an exemplary an imprint substrate employable to form the light-emitting device of FIG. 1.
Figure 5:
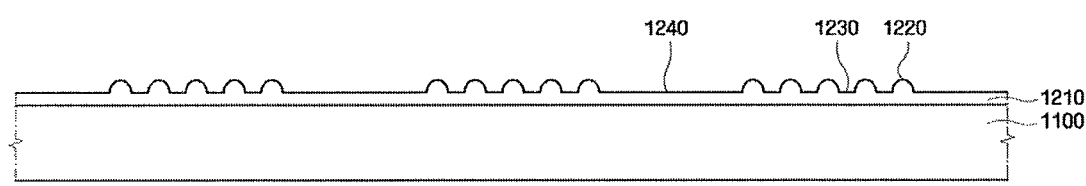
FIG. 5 illustrates a cross-sectional view of an exemplary embodiment of the imprint substrate employable to form the light-emitting device of FIG. 4, taken along the line C-C' of FIG. 4.

First, an exemplary imprint substrate employable for fabricating the light-emitting device L1 of FIG. 1 will be described with reference to FIGS. 4 through 10. FIG. 4 illustrates a perspective view of the exemplary embodiment of an imprint substrate employable to form the light-emitting device L1 of FIG. 1. FIG. 5 illustrates a cross-sectional view of an exemplary embodiment of the imprint substrate of FIG. 4 employable to form the light-emitting device L1 of FIG. 1, taken along the line C-C' of FIG. 4.

Referring to FIGS. 4 and 5, an insulation film 1210 for imprinting may be formed on an imprint substrate 1100.

The imprint substrate 1100 may be made of the same material as a glass substrate (10 of FIG. 3) on which the light-emitting device (100 of FIG. 3) is mounted.

The imprinting insulation film 1210 may include silicon nitride or silicon oxide. A plurality of imprinted uneven patterns 1220 is formed on the imprinting insulation film 1210. The plurality of imprinted uneven patterns 1220 maybe spaced apart from each other, and adjacent ones of the plurality of imprinted uneven patterns 1220 may be connected to each other by respective first imprint planar connection patterns 1230. Each of the imprinted uneven patterns 1220 may have a curved cross-section shape. In one or more embodiments, in a region on which a group of the plurality of imprinted uneven patterns 1220 is formed, curved shapes of the imprinted uneven patterns 1220 and planar shapes of the first imprinted planar connection patterns 1230 appear periodically. The plurality of imprinted uneven patterns 1220 may be further arranged in groups. Second imprinted planar connection patterns 1240 may connect a region where one group of the plurality of imprinted uneven patterns 1220 are formed to a region where another group of the plurality of imprinted uneven patterns 1220 are formed.

In one or more embodiments, the imprinted uneven patterns 1220 may include convex patterns. Convex pattern shapes of the imprinted uneven patterns 1220 may correspond to the concave pattern shapes of the light-emitting device L1. More particularly, e.g., the convex pattern shapes of the imprinted uneven patterns 1220 may have substantially the same diameters and heights as those of the concave pattern shapes of uneven patterns 220 the light-emitting device L1, other than one of them being concave and the other being convex in overall shape. Further, the convex pattern shapes of the exemplary imprinted uneven patterns 1220 may be aligned with the concave pattern shapes of the exemplary uneven patterns 220 of the light-emitting device L1.

Conventional convex dome shaped LEDs converge light into one spot, and are not generally suitable as LEDs for indoor/outdoor illumination, which benefit from light dispersion. As such, one approach is to provide a method of fabricating a light-emitting element with a lens pattern having concave and convex patterns. According to such a proposed method, the light-emitting element is disposed in a groove formed on a substrate, the groove is filled with an insulation layer having fluidity, and the insulation layer disposed on the light-emitting element is pressed using a pressing tool having a concave pattern and a convex pattern formed thereon. In the proposed method, however, since the light-emitting element has a mixture concave and convex patterns, it serves not only to disperse but also to converge light. As a result, use of the light-emitting element is not apparent and a groove is essentially required to store the fluid insulation layer, making it difficult to fabricate the light-emitting element.

In contrast, as described herein, in one or more embodiments, the light-emitting device may include uneven patterns that may include all concave or all convex shaped patterns such that the light may be converged or dispersed and fabrication may be simplified.

An exemplary embodiment of a method of fabricating the imprint substrate employable for fabricating the light-emitting device L1 of FIG. 1 will be described below. FIGS. 6, 7, 8, 9, and 10 illustrate cross-sectional views sequentially illustrating an exemplary embodiment of a fabricating method of the imprint substrate of FIGS. 4 and 5 employable for fabricating the light-emitting device L1 of FIG. 1.

Figure 6:
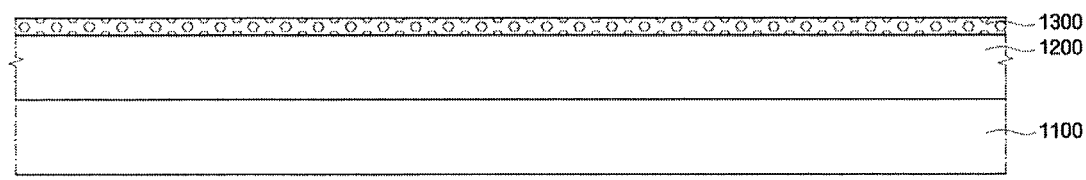
FIGS. 6, 7, 8, 9, and 10 illustrate cross-sectional views sequentially illustrating an exemplary embodiment of a fabricating method of the imprint substrate of FIGS. 4 and 5 employable for fabricating the light-emitting device of FIG. 1.

Referring first to FIG. 6, an imprinting insulation film 1200 and an imprinting photoresist film 1300 may be sequentially formed on the imprint substrate 1100. The imprinting photoresist film 1300 may include a positive-type photoresist.

Figure 7:
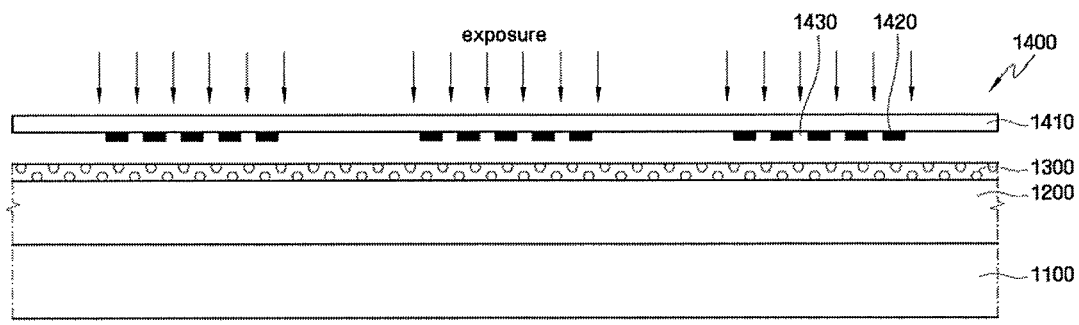

Referring to FIG. 7, a mask 1400 may be aligned on the imprint substrate 1100. The mask 1400 may include a mask substrate 1410. The mask substrate 1410 may include a plurality of light-shielding regions 1420 and a plurality of light transmitting regions 1430. The plurality of light transmitting regions 1430 may extend between each of the plurality of light-shielding regions 1420.

The imprinting photoresist film 1300 may then be exposed using the mask 1400. As a result of the exposure, exposed portions of the imprinting photoresist film 1300 of a positive type in the light irradiated portion is softened.

Figure 8:
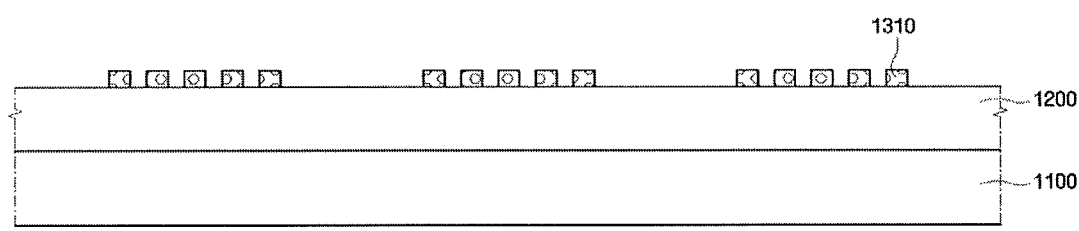

Referring to FIG. 8, the imprinting photoresist film 1300 may be developed to remove the softened portions thereof to form a plurality of imprinting-first-uneven patterns 1310. The plurality of imprinting-first-uneven patterns 1310 may be spaced apart from each other. The plurality of imprinting-first-uneven patterns 1310 may be made of the imprinting photoresist. The plurality of imprinting-first-uneven patterns 1310 may be formed at locations corresponding to the plurality of light-shielding regions 1420 of the mask (1400 of FIG. 7). The imprinting insulation film 1200 may be exposed at a region where the plurality of imprinting-first-uneven patterns 1310 are not formed. The plurality of imprinting-first-uneven patterns 1310 may have a roughly cylindrical shape.

Figure 9:
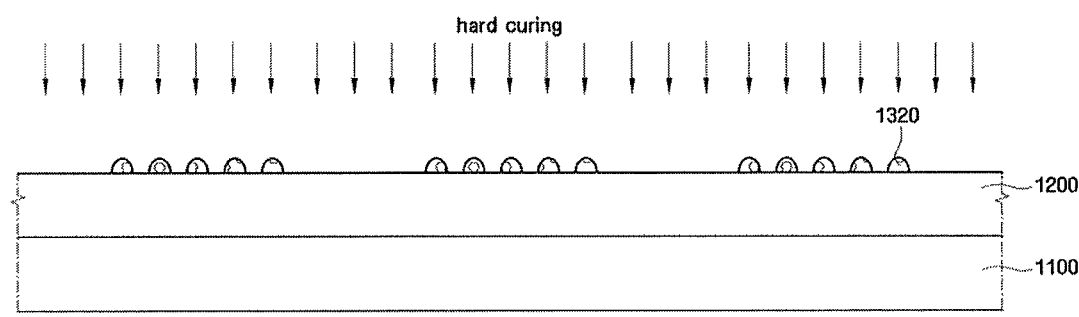

Referring to FIG. 9, the imprinting-first-uneven patterns 1310 may be subjected to hard curing. In such embodiments, heat applied to the imprinting-first-uneven patterns 1310 made of imprinting photoresist may melt the photoresist material. Thus, as a result of the applied heat, the plurality of imprinting-first-uneven patterns 1310 may develop and harden into a plurality of imprinting-second-uneven patterns 1320. The imprinting-second-uneven patterns 1320 may have hemispherical shapes as a result of the surface tension. The applied heat may be at a temperature equal to and/or ranging from approximately 130° C. to approximately 140° C.

Figure 10:
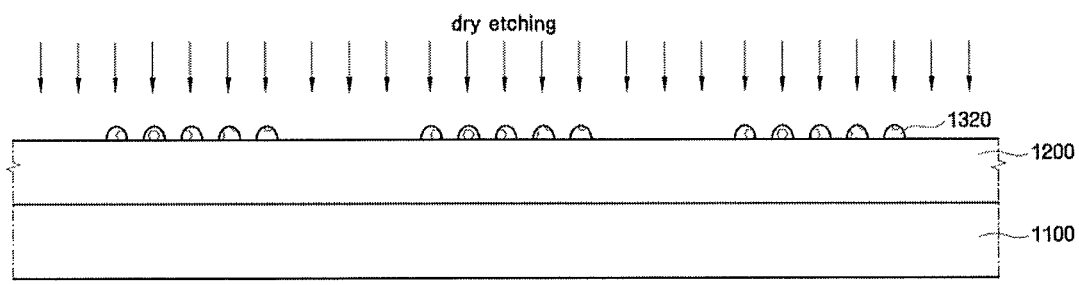

Referring to FIG. 10, the imprinting insulation film 1200 may be dry etched using the hemispherical imprinting-second-uneven patterns 1320, made of the imprinting photoresist, as a mask. For example, oxygen gas may be used as an etching gas. More particularly, e.g., the etching gas may include CF4. In one or more embodiments, the second uneven patterns 1320 made of the imprinting photoresist are also slightly etched and removed. An exposure time in which the imprinting insulation film 1200 is exposed to the etching gas may vary according to a thickness difference of the second uneven patterns 1320 made of imprinting photoresist. Therefore, the second uneven patterns 1320 made of imprinting photoresist may directly transcribed into the imprinting insulation film 1200 without changing shapes. Fabrication of the imprint substrate 1100 including the imprinted uneven patterns 1220 of convex shape corresponding to the second uneven patterns 1320 shown in FIG. 5 may be complete.

In one or more embodiments, by transcribing the uneven patterns, e.g., 220 of FIG. 3, to multiple light-emitting devices using a single imprint substrate 1100 having the imprinted uneven patterns 1220, the manufacturing cost required for forming uneven patterns, e.g., 220, may be reduced.

Hereinafter, a fabricating method of the light-emitting device L1 of FIG. 1 will be described in detail with reference to FIGS. 11 through 19. FIGS. 11, 12, 13, 14, 15, 16, 17, 18, and 19 illustrate cross-sectional views sequentially illustrating an exemplary embodiment of a fabricating method of the light-emitting device L1 of FIG. 1.

Figure 11:
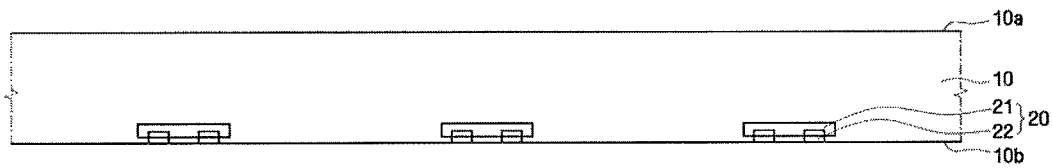
FIGS. 11, 12, 13, 14, 15, 16, 17, 18, and 19 illustrate cross-sectional views sequentially illustrating an exemplary embodiment of a fabricating method of the light-emitting device of FIG. 1.

Referring to FIG. 11, the substrate 10 may include the embedded zener diode 20. In such embodiments, the opposite side 10b of the substrate 10 may be subjected to, e.g., implantation, thermal diffusion, or plasma doping using first-type impurity to form the first-type semiconductor region 21. In one or more embodiments, implantation, thermal diffusion, or plasma doping may then be performed on the first-type semiconductor region 21 using second-type impurity having a conductivity type opposite to that of the first-type impurity so as to contact the first-type semiconductor region 21 and to form the second-type semiconductor region 22.

Figure 12:
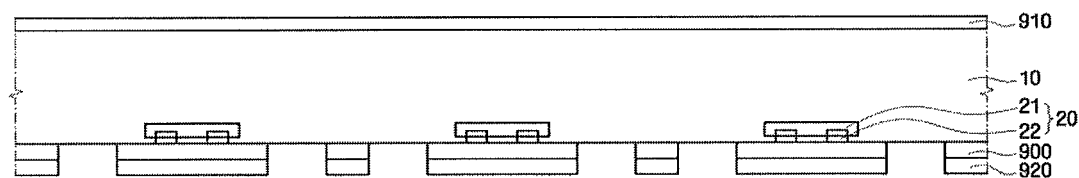

Referring to FIG. 12, a protective pattern 900 may be formed on the second surface 10b of the substrate 10. A protective film 910 may be formed on the first surface 10a, e.g., a top surface, of the substrate 10. More particularly, in one or more embodiments, while not explicitly shown, the protective film 910 may actually be formed on both surfaces 10a, 10b of the substrate 10, and a first photoresist pattern 920 may be formed on the protective film 910 formed on the second surface 10b of the substrate 10. More particularly, the photoresist pattern 920 may correspond to the groove 35 to be formed on the second surface 10b, e.g., the bottom surface, of the substrate 10. The protective film 910 (not shown on the second surface 10b) on the second surface 10b may be etched using the groove photoresist resist pattern 920 as an etch mask to form the protective pattern 900. The groove photoresist resist pattern 920 and the protective pattern 900 may be formed on the potential regions of light-emitting element mount regions I (FIG. 13) and the isolation regions II (FIG. 13) and may expose potential regions of the groove 35 and the via hole 30.

In one or more embodiments, the protective film 910 may be formed on the first surface 10a, e.g., the top surface, of the substrate 10 to prevent the surface 10a of the substrate 10 from being damaged by a solution, e.g., a KOH solution, during etching of the groove 35. In one or more embodiments, the protective pattern 900 may be formed between the groove photoresist resist pattern 920 and the second surface 10b of the substrate 10 to prevent the surface 10b of the substrate 10 from being damaged while perform the etching of the groove 35 using, e.g., KOH solution. The pattern of the groove 35 may correspond to, e.g., be that same as, the pattern of the groove photoresist resist pattern 920. The protective pattern 900 and the protective film 910 may include, e.g., silicon nitride or silicon oxide.

Figure 13:
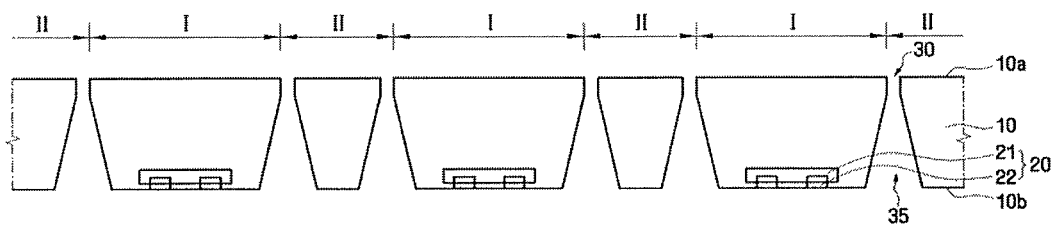

Referring to FIGS. 12 and 13, the second surface 10b of the substrate 10 may be etched using the protective pattern 900 as an etch mask to form one, some or all of the grooves 35 and one, some or all of the via holes 30 between respectively adjacent ones of the plurality of light-emitting element mount regions I.

Etching of the substrate 10 may be performed by, e.g., wet etching. The wet etching may be performed using an anisotropic wet etchant solution such as KOH solution. Accordingly, the groove 35 shaped of a pyramid having a cross section tapering from the second surface 10b to the first surface 10a of the substrate 10 may be formed in the substrate 10 exposed to the wet etchant solution.

The via hole 30 may be formed at an end of the groove 35 by adjusting an exposure time of the substrate 10. In addition, since the protective film 910 is formed on the second surface of the substrate 10, as described above, the etching may be interrupted by the protective film 910 in the middle of forming the groove 35 using the wet etchant solution.

The mask pattern 910 and the mask film 900 remaining after formation of the groove 35 and the via hole 30, may be removed using e.g., a BOE (Buffered Oxide Echant) or HF.

Figure 14:
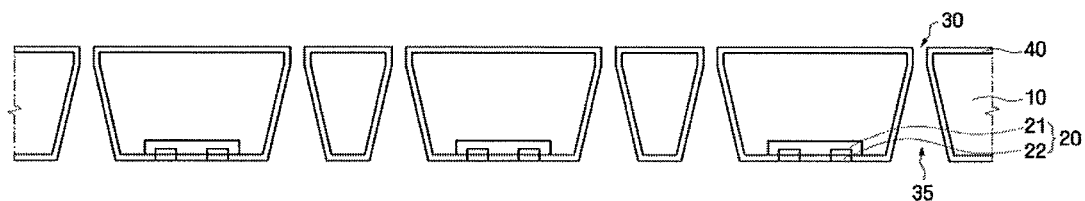

Referring to FIG. 14, the first insulation film 40, which may include oxide, may be formed on exposed surfaces (including some or all of the first surface 10a and the second surface 10b) of the substrate 10 using, e.g., thermal oxidation.

Figure 15:
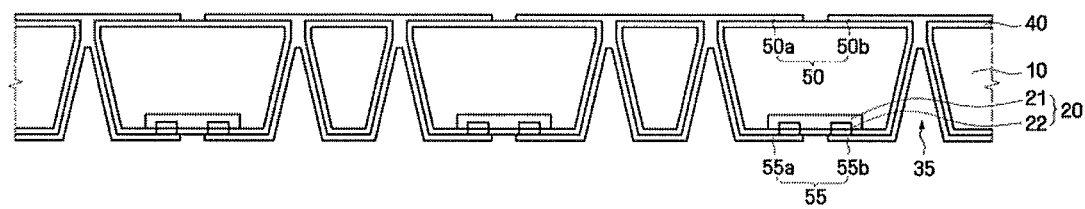

Referring to FIG. 15, a conductive material may be deposited on both surfaces 10a, 10b of the substrate 10 using, e.g., sputtering or electroplating, to form the front-surface electrode 50 at the first surface 10a side of the substrate 10 and the back-surface electrode 55 at the second surface 10b side of the substrate 10. The sequence of forming the front-surface electrode 50 and the back-surface electrode 55 may be reversed.

Figure 16:
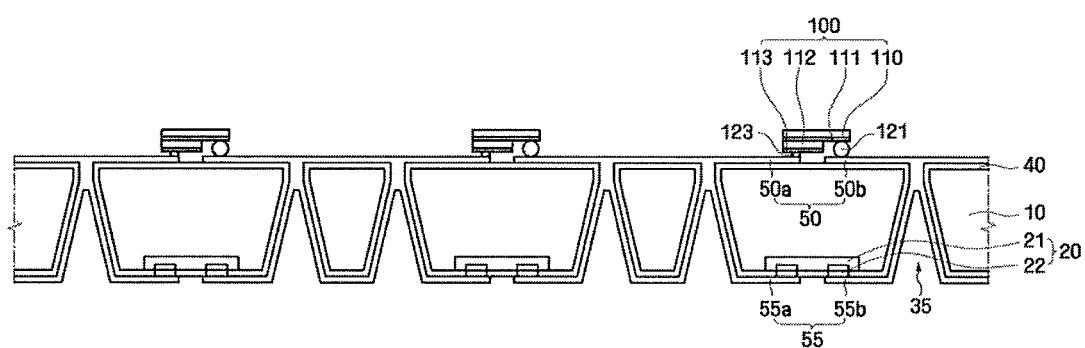

Referring to FIG. 16, the light-emitting element 100 may be mounted on the front-surface electrode 50.

Figure 17:
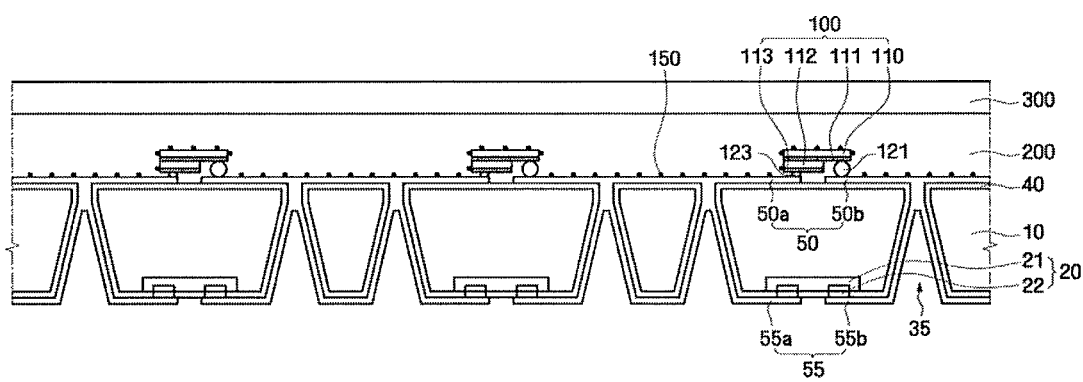

Referring to FIG. 17, an insulation film 200 covering the light-emitting element 100 and the front-surface electrode 50 may be formed on the first surface 10a of the substrate 10.

The insulation film 200 may be formed using, e.g., spin coating, dropping, or spray coating. Meanwhile, the insulation film 200 may include phosphor 150. The phosphor 150 may be mixed with silicon resin forming the insulation film 200 and then coated on the substrate 10 using, e.g., spin coating, dropping, or spray coating.

In one or more embodiments, e.g., the embodiment of FIG. 1, the resultant product may be allowed to stand until the phosphor 150 is precipitated, and the silicon resin is then cured, thereby forming the second insulation film 210.

Next, a photoresist film 300 may be formed on the insulation film 200 to a uniform thickness.

In the exemplary embodiment of FIGS. 4 through 17, the imprint substrate 1100 including the plurality of imprinted uneven patterns 1220 may be employed. The imprint substrate 1100 may be fabricated before beginning processing of the substrate 10. Embodiments are not limited thereto. For example, the imprint substrate 1100 may be fabricated after processing of the substrate 10 has started, e.g., the substrate 10 includes the light-emitting element 100, the insulation film 200 covering the light-emitting element 100, and the photoresist film 300 sequentially formed on the first surface 10a of the substrate 10. Thus, e.g., the sequence of providing the imprint substrate 1100 and the substrate 10 may be reversed. Further, e.g., the imprint substrate 1100 and the substrate 10 may be simultaneously fabricated.

Figure 18:
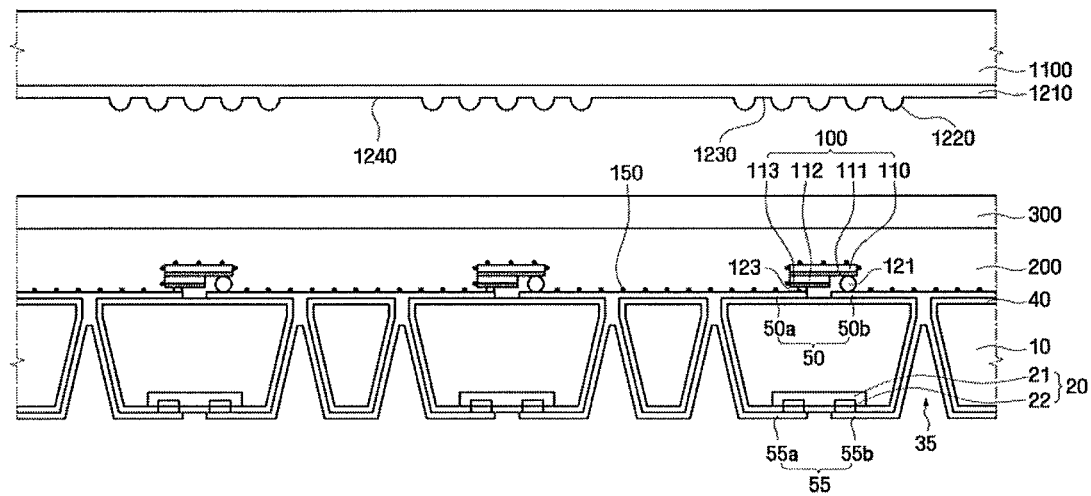

Referring to FIG. 18, the imprint substrate 1100 may be aligned relative to the substrate 10 such that the imprinted uneven patterns 1220 and the photoresist film 300 are opposite to and face each other.

The imprint substrate 1100 may then be compressed on the photoresist film 300 to transcribe a plurality of photoresist uneven patterns (320 of FIG. 19) corresponding to the plurality of imprinted uneven patterns 1220.

Figure 19:
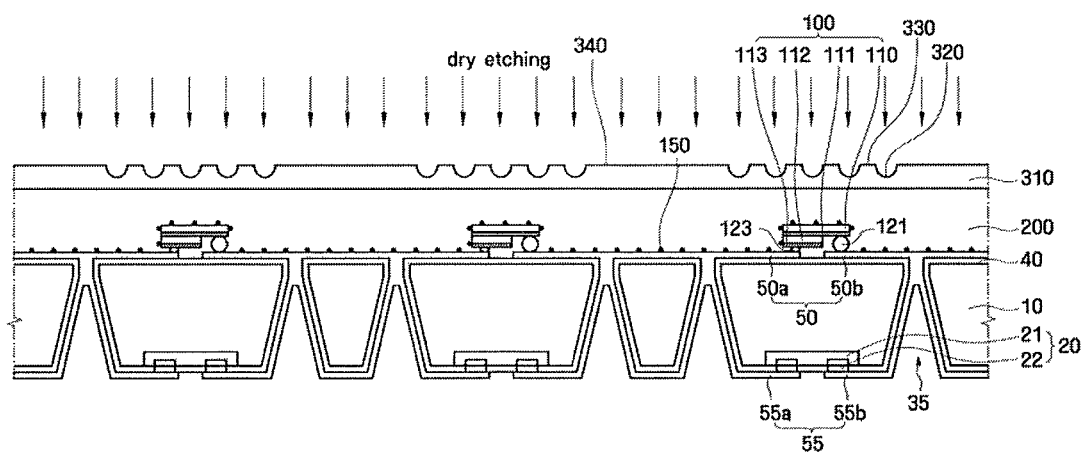

Referring to FIGS. 18 and 19, a photoresist pattern 310 may be formed on the photoresist film 300. The photoresist pattern 310 may include a plurality of photoresist uneven patterns 320, first photoresist planar connection patterns 330 connecting the photoresist uneven patterns 320 to each other, and second photoresist planar connection patterns 340, which may correspond to, e.g., are complementary to, the shapes of the plurality of imprinted uneven patterns 1220, the first imprinted planar connection patterns 1230, and the second imprinted planar connection patterns 1240, respectively. More particularly, e.g., when the imprinted uneven patterns 1220 are convex patterns, the photoresist uneven patterns 320 may be formed as concave patterns so as to be complementary with the imprinted uneven patterns 1220.

The insulation film 200 may then be dry etched using the photoresist pattern 310 as an etch mask. In one or more embodiments, the photoresist pattern 310 may also be etched by etching gas. In such embodiments, an exposure time in which the insulation film 200 is exposed to the etch gas may vary according to the thickness difference of the photoresist pattern 310. Therefore, as shown in FIG. 3, the uneven patterns 220, the first photoresist planar connection patterns 230 connecting the uneven patterns 220, and the second planar connection patterns 240 formed in the isolation regions II, which correspond to the plurality of photoresist uneven patterns 320, the first photoresist planar connection patterns 330 connecting the photoresist uneven patterns 320, and the second photoresist planar connection patterns 340, respectively, may be formed on the second insulation film 210. Consequently, the plurality of uneven patterns 220, which are concave patterns, may be formed on the second insulation film 210, complimentary with the plurality of imprinted uneven patterns 1220. Since the second insulating material 200 may be etched overall, the overall thickness of the second insulation film 210 may be smaller compared to a case where the second insulating material 200 is not etched.

In one or more embodiments, since uneven patterns, e.g., 220, may be formed on multiple substrates, e.g., 10, using one imprint substrate, e.g., 1100, including imprinted uneven patterns, e.g., 1220, fabricating methods of the light-emitting device may be simplified and advantageous for mass production of the light-emitting device. In addition, in one or more such embodiments, since the imprinted uneven patterns are not in direct contact with an insulation film of the substrate but are transcribed on a photoresist film of the substrate, they do not necessarily have fluidity, unlike the insulation film. Therefore, in one or more embodiments, it is not necessary to separately form a groove using a structure protruding beyond an upper portion of first surface of the substrate to prevent the insulation film having fluidity from flowing out. In addition, it is not necessary to store the insulation film. Further, the substrate may be substantially planar as a whole. Therefore, the fabricating process of the substrate may be simplified as compared to conventional methods.

Figure 20:
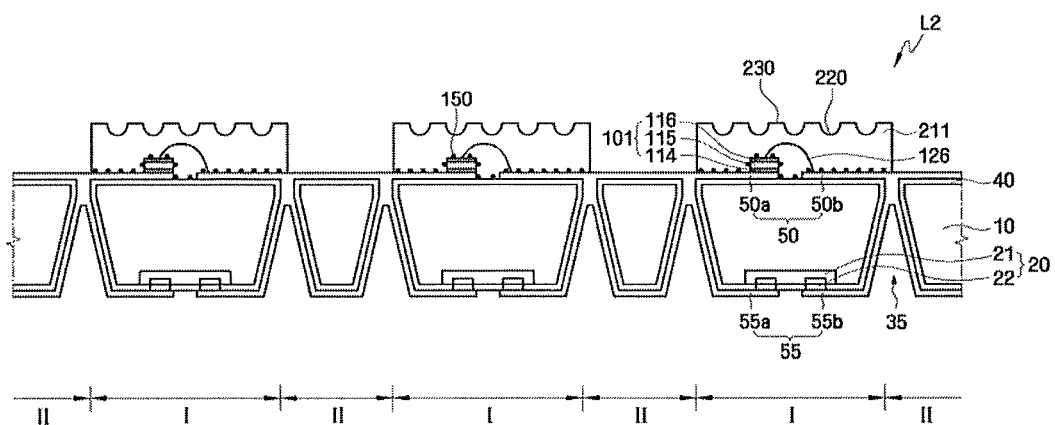
FIG. 20 illustrates a cross-sectional view of another exemplary embodiment of a light-emitting device.

Hereinafter, another exemplary embodiment of a light-emitting device L2 will be described with reference to FIG. 20. FIG. 20 illustrates a cross-sectional view of the light-emitting device L2. In general, only differences between the exemplary light emitting device L1 of FIG. 1 and the exemplary light emitting device L2 of FIG. 20 will be described below.

Referring to FIG. 20, one or more of the light-emitting element 101 may be vertically disposed. That is, the light-emitting element 101 may include a first conductive pattern 114 of a first conductivity type, a light-emitting pattern 115, and a second conductive pattern 116 of a second conductivity type. The first conductive pattern 114, the light-emitting pattern 115, and the second conductive pattern 116 may be sequentially stacked. In the light-emitting element 101, the first conductive pattern 114 may be directly connected to the first front-surface electrode 50a, and the second conductive pattern 116 may be connected to the second front-surface electrode 50b through a wire 126. Embodiments are not limited thereto. For example, the first conductive pattern 114 and the second conductive pattern 116 may be alternatively connected to the second front-surface electrode 50b and the first front-surface electrode 50a front-surface electrode 50, respectively.

In the light-emitting element 101, an insulation film 211 may only be disposed on the light-emitting device mount regions I and may not be located on the isolation regions II. Such embodiments may facilitate separation of the light-emitting device 101 as a discrete device for each of the light-emitting device mount regions I.

Figure 21:
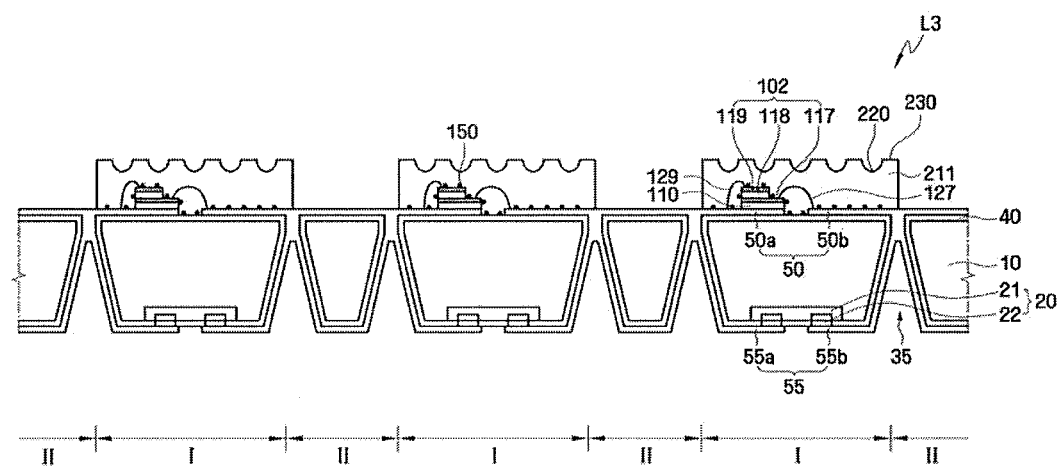
FIG. 21 illustrates a cross-sectional view of another exemplary embodiment of a light-emitting device.

Hereinafter, another exemplary embodiment of a light-emitting device L3 will be described with reference to FIG. 21. FIG. 21 illustrates a cross-sectional view of the light-emitting device L3. In general, only differences between the light emitting device L3 of FIG. 21 and the light emitting device L2 of FIG. 20 will be described below.

Referring to FIG. 21, the light emitting device L3 may include a light-emitting element 102. The light-emitting element 102 may be may be laterally disposed. More particularly, e.g., the light-emitting device 102 may include a first conductive pattern 117 of a first conductivity type, a light-emitting pattern 118, and a second conductive pattern 119 of a second conductivity type. The first conductive pattern 117, the light-emitting pattern 118, and the second conductive pattern 119 may be sequentially stacked on the substrate 110. In the light-emitting device 102, the first conductive pattern 117 may be connected to the second front-surface electrode 50b through a first wire 127, and the second conductive pattern 119 may be connected to the first front-surface electrode 50a through a second wire 129. Embodiments are not limited thereto. More particularly, the first conductive pattern 117 and the second conductive pattern 119 may be alternatively connected to the second front-surface electrode 50b and the first front-surface electrode 50a front-surface electrode 50, respectively.

In the light-emitting device 102, an insulation film 211 is located on only the light-emitting device mount regions I but not located on the isolation regions II, which facilitates separation of the light-emitting device 101 according to this embodiment as a discrete device for each of the light-emitting device mount regions I.

Figure 22:
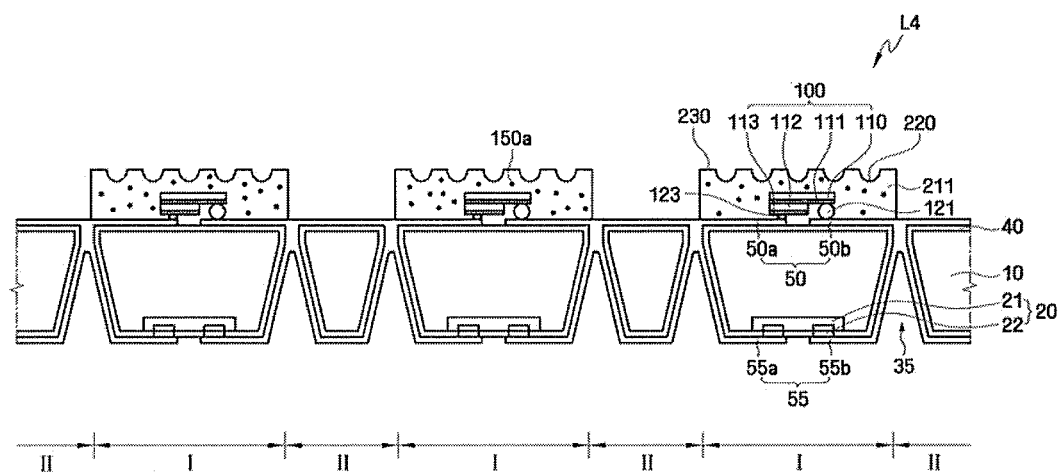
FIG. 22 illustrates a cross-sectional view of another exemplary embodiment of a light-emitting device.

Hereinafter, another exemplary embodiment of a light-emitting device L4 will be described with reference to FIG. 22. FIG. 22 illustrates a cross-sectional view of the light-emitting device L4. In general, only differences between the exemplary embodiment L1 of FIG. 1 and the exemplary embodiment L3 of FIG. 4 will be described below.

The light-emitting device L4 of FIG. 22 is substantially the same as the light emitting device L1 of FIG. 1, except that an insulation film 211 is located on only the light-emitting device mount regions I and a phosphor 150a is uniformly distributed inside the insulation film 211, rather than being locally distributed at a lower portion of the insulation film 211.

Figure 23:
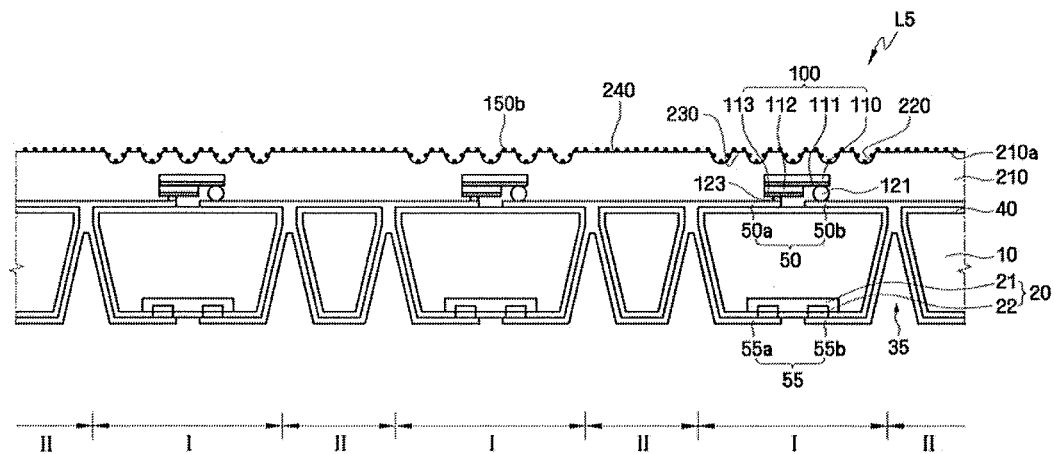
FIG. 23 illustrates a cross-sectional view of another exemplary embodiment of a light-emitting device.

Hereinafter, another exemplary embodiment of a light-emitting device L5 will be described with reference to FIG. 23. FIG. 23 illustrates a cross-sectional view of the light-emitting device L5.

The light emitting device L5 of FIG. 23 is substantially the same as the light emitting device L1 of FIG. 1, except that a phosphor 150b is locally distributed on a surface 210a of an insulation film 210. More particularly, the phosphor 150b is located on surfaces of uneven patterns 220 on light-emitting device mount regions I and first planar connection patterns 230 connecting the uneven patterns 220 to each other and on second planar connection patterns 240 on isolation regions II.

Figure 24:
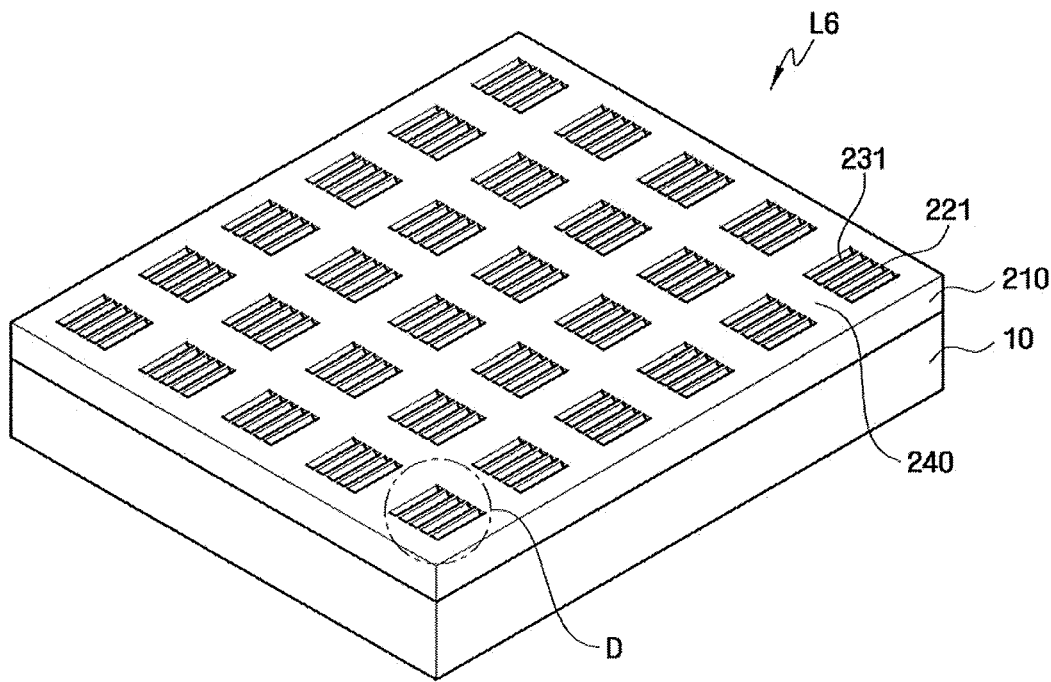
FIG. 24 illustrates a cross-sectional view of another exemplary embodiment of a light-emitting device.
Figure 25:
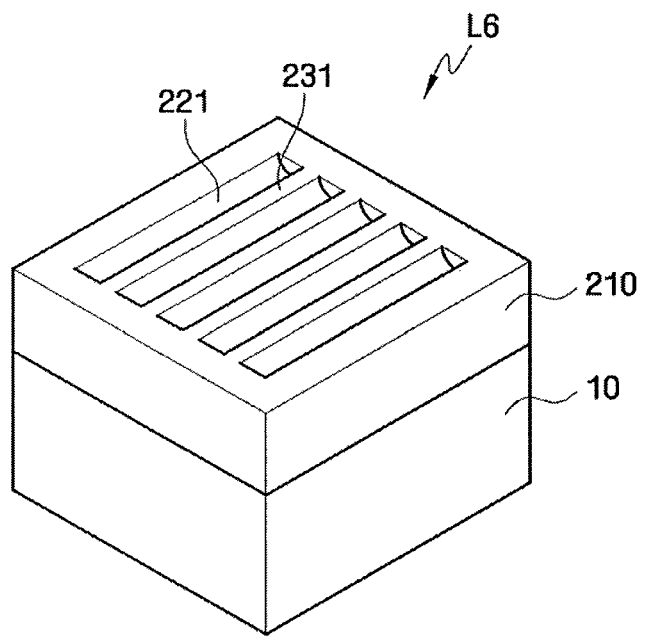
FIG. 25 illustrates an enlarged perspective view of a portion 'D' of the light-emitting device of FIG. 24.

Hereinafter, another exemplary embodiment of a light-emitting device L6 will be described with reference to FIGS. 24 and 25. FIG. 24 illustrates a cross-sectional view of the light-emitting device L6. FIG. 25 illustrates an enlarged perspective view of a portion 'D' of FIG. 24.

Referring to FIGS. 24 and 25, like the previous embodiments, the light-emitting device L6 includes a plurality of uneven patterns 221. Like the previous embodiments, the uneven patterns 221 are concave patterns recessed from the surface 210a of the insulation film 210 toward an inner portion of the second insulation film 210, but the uneven patterns 221 have a semicircular-cylindrical shape.

More particularly, one or more of the plurality of uneven patterns 221 shaped of semicircular cylinders are arranged one or more of the light-emitting device mount regions 1 in parallel with each other. For example, for each of the light-emitting device mount regions 1, one or more of the plurality of uneven patterns 221 may be arranged in a stripe type manner. Accordingly, first planar connection patterns 231 connecting the plurality of uneven patterns 221 to each other may also have a stripe type shape. The second planar connection patterns 240 may be provided in the isolation regions II. More particularly, e.g., the isolation regions II may not include any of the uneven patterns 221 and/or may only include the second planar connection patterns 240.

Figure 26:
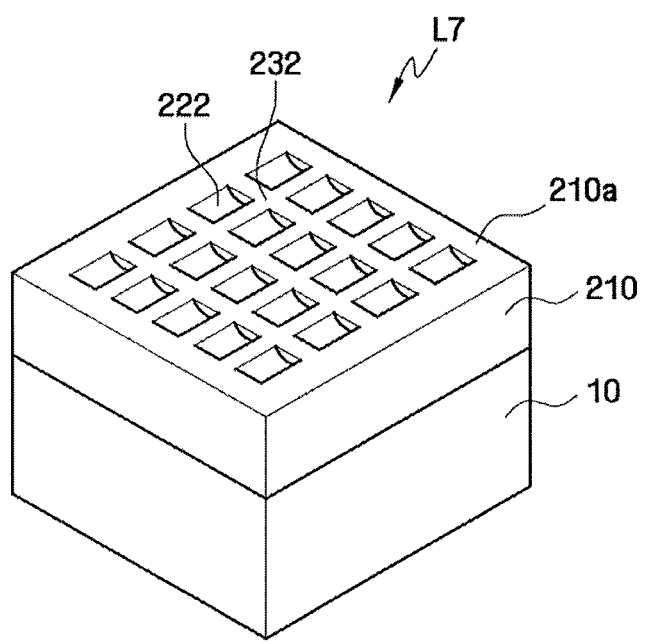
FIG. 26 illustrates a partially enlarged perspective view of another exemplary embodiment of a light-emitting device.

Hereinafter, another exemplary embodiment of a light-emitting device L7 will be described with reference to FIG. 26. FIG. 26 illustrates a partially enlarged perspective view of the light-emitting device L7.

The light-emitting device L7 is substantially the same as the light-emitting device L6, except that a plurality of uneven patterns 222 and first planar connection patterns 232 are arranged in a dot type manner. Like the previous embodiments, the uneven patterns 221 are concave patterns recessed from the surface 210a of the second insulation film 210 toward an inner portion of the second insulation film 210, but like the light-emitting device L6, the "dots" of the uneven patterns 221 have a semicircular-cylindrical shape.

Figure 27:
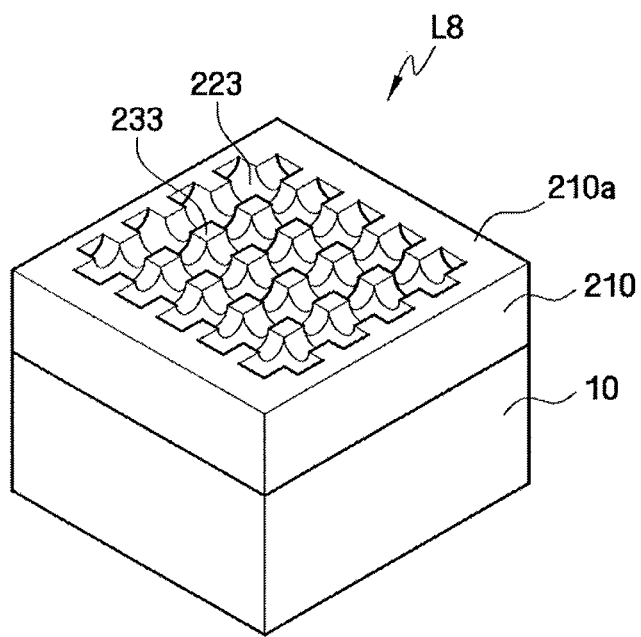
FIG. 27 illustrates a partially enlarged perspective view of another exemplary embodiment of a light-emitting device.

Hereinafter, another exemplary embodiment of a light-emitting device L8 will be described with reference to FIG. 27. FIG. 27 illustrates a partially enlarged perspective view of the light-emitting device L8.

The light-emitting device L8 of FIG. 27 is substantially the same the light-emitting device L6 of FIGS. 24 and 25, except that a plurality of uneven patterns 223 and first planar connection patterns 233 are arranged in a mesh type manner.

Figure 28:
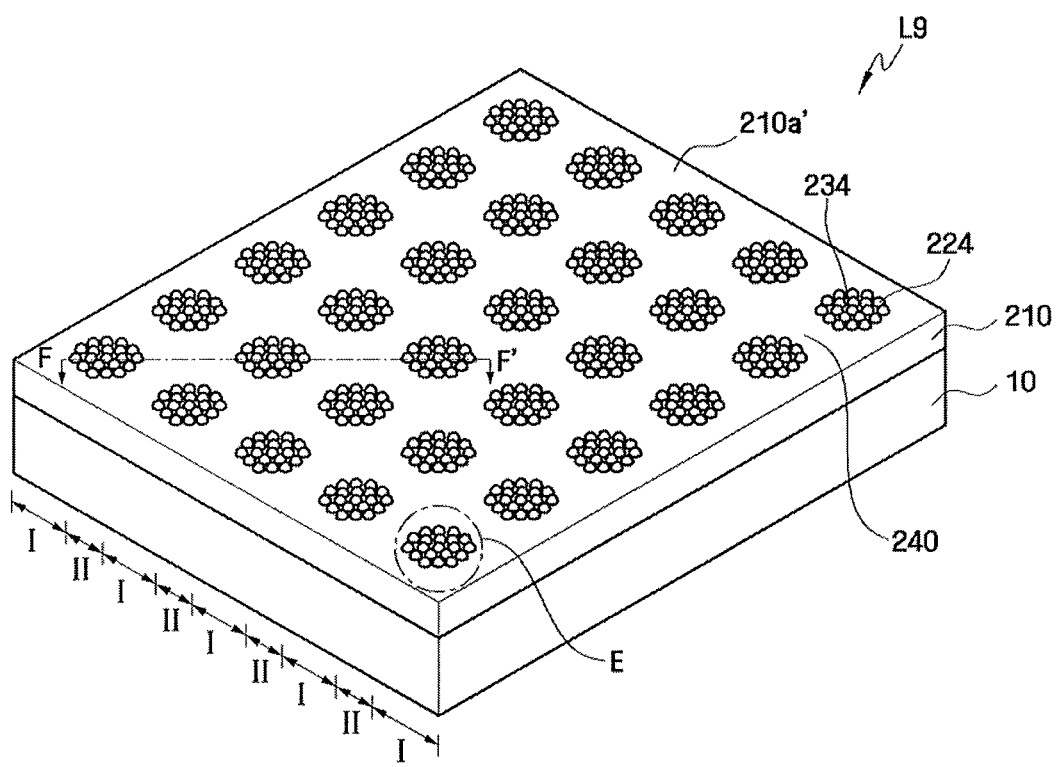
FIG. 28 illustrates a cross-sectional view of another exemplary embodiment of a light-emitting device.
Figure 29:
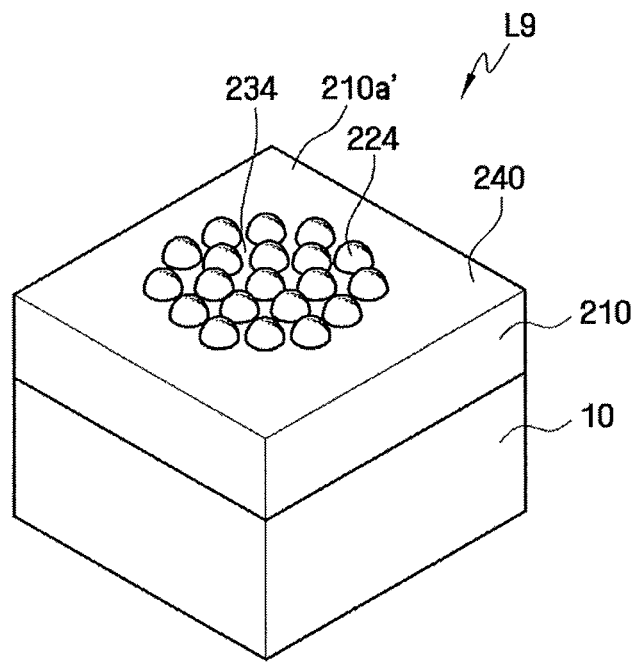
FIG. 29 illustrates an enlarged perspective view illustrating a portion 'E' of the light-emitting device of FIG. 28.
Figure 30:
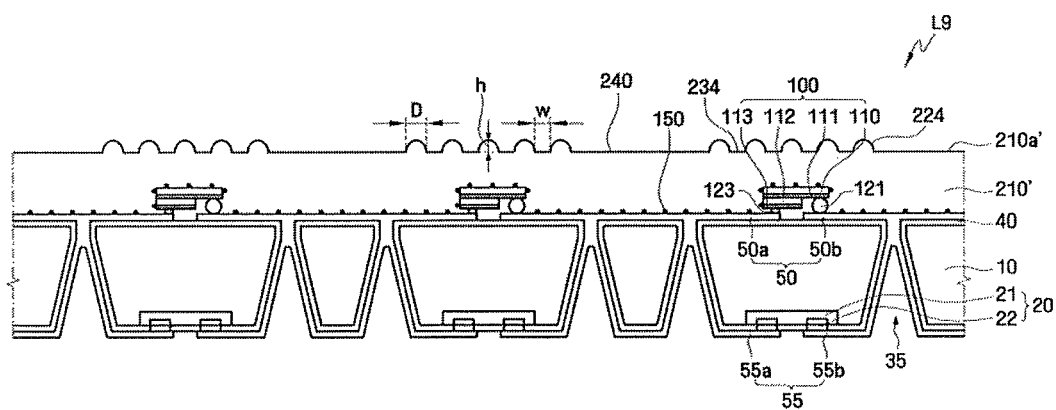
FIG. 30 illustrates a cross-sectional view of the exemplary light-emitting device of FIG. 28, taken along the line F-F' of FIG. 28.

Hereinafter, another exemplary embodiment of a light-emitting device L9 will be described with reference to FIGS. 28 through 30. FIG. 28 illustrates a cross-sectional view of the light-emitting device L9 of FIG. 28. FIG. 29 illustrates an enlarged perspective view illustrating a portion 'E' of the light-emitting device of FIG. 28. FIG. 30 illustrates a cross-sectional view of the light-emitting device of FIG. 28, taken along the line F-F' of FIG. 28.

The light-emitting device L9 is different from that of the previously described embodiments in that a plurality of uneven patterns 224 are all convex patterns. More particularly, relative to the light-emitting device L1 of FIGS. 1-3, the plurality of uneven patterns 224 are convex shaped. The uneven patterns 224 are spaced apart from each other in light-emitting device mount regions I. Adjacent ones of the uneven patterns among the plurality of uneven patterns 224 are connected to each other by first planar connection patterns 234. The isolation regions II may include the second planar connection patterns 240. More particularly, e.g., a surface 210a' of the insulation film 210' overlapping isolation regions II may only include the second planar connection patterns 240 and/or may not include any of the uneven patterns 224, and portions of the surface 210a' of the insulation film 210 overlapping the light-emitting device mount regions I may include the uneven patterns 224 and the first planar connection patterns 234.

The uneven patterns 224 may have substantially the same size and/or shape as the uneven patterns 220 of the light-emitting device L1 of FIGS. 1-3, except that the uneven patterns 224 protrude outwardly from the surface 210a of the second insulation film 210.

In one or more embodiments such as the light-emitting device L9 including the uneven patterns 224 including only convex patterns, linearity of light may be improved, and the light-emitting device L9 may be employed as an LED for transportation, e.g., a car headlight.

Hereinafter, an exemplary embodiment of a method of fabricating the light-emitting device L9 of FIG. 28 will be described in detail with reference to FIGS. 4 through 10 and 30 through 35. In general, only differences between the exemplary embodiments of FIGS. 30-35 and the exemplary embodiments of FIGS. 4-10 will be described below. In the current embodiment, imprinted uneven patterns of an imprint substrate are concave. In addition, the imprinted uneven patterns are compressed on a photoresist film of the light-emitting device, e.g., L9, thereby forming convex uneven patterns of the light-emitting device L9. The convex uneven patterns 224 may be formed on the insulation layer 210' of the light-emitting device L9.

Figure 31:
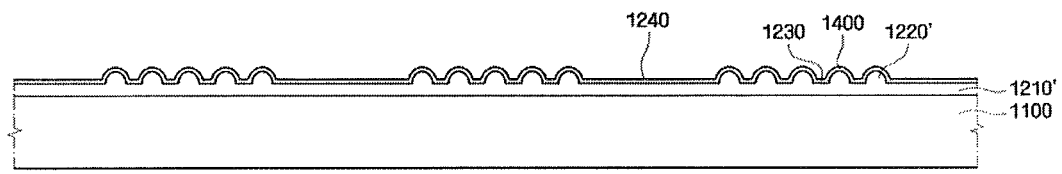
FIGS. 31, 32, and 33 sequentially illustrate an exemplary embodiment of a fabricating method of the imprint substrate employable for fabricating the light-emitting device of FIG. 28.
Figure 32:
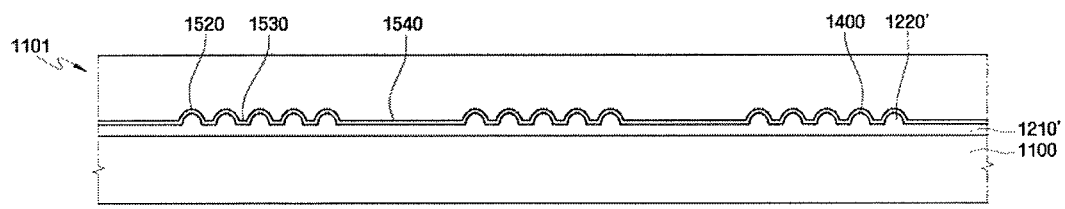
Figure 33:
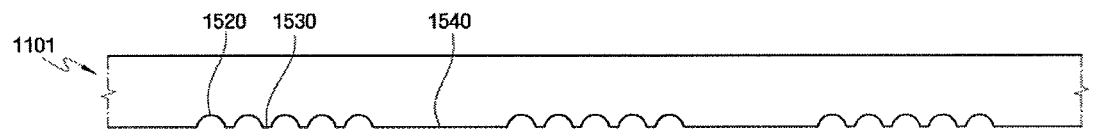

First, an exemplary embodiment of a fabricating method of the imprint substrate 1100 employable in fabricating the light-emitting device L9 will be described with reference to FIGS. 4 through 10 and 31 through 33. In general, only differences between the exemplary embodiment of FIGS. 31 through 33 and FIGS. 4-10 will be described below. FIGS. 31 through 33 sequentially illustrate an exemplary embodiment of a fabricating method of the imprint substrate employable for fabricating the light-emitting device L9 of FIG. 28.

First, referring to FIGS. 4 through 10, the plurality of imprinted uneven patterns 1220, the first imprinted planar connection patterns 1230, and the second imprinted planar connection patterns 1240 may be formed on an imprinting insulation film 1210' disposed on the imprint substrate 1100. Referring to FIGS. 31-33, in one or more embodiments, the imprint substrate 1100, the imprinting insulation film 1210', imprinted uneven patterns 1220', the first imprinted planar connection patterns 1230, and the second imprinted planar connection patterns 1240 respectively correspond to the imprint substrate 1100, the imprinting insulation film 1210', the imprinted uneven patterns 1220', the first imprinted planar connection pattern 1230, and the second imprinted planar connection patterns 1240, similar to that described above with regard to FIGS. 4-10.

Referring to FIG. 31, a seed metal layer 1400 may be formed on the imprinting insulation film 1210', the imprinted uneven patterns 1220', the first imprinted planar connection patterns 1230, and the second imprinted planar connection patterns 1240 to a uniform thickness. The seed metal layer may include, e.g., copper, silver, and/or platinum.

Referring to FIG. 32, an imprint metal may be electroplated on the seed metal layer 1400, thereby forming an imprinting substrate 1101, e.g., imprinting metal. Like the seed metal layer 1400, the imprinting substrate 1101 may include, e.g., copper, silver, and/or platinum. Embodiments are not limited thereto, e.g., the seed metal layer 1400 and/or the imprinting substrate 1101 may include other materials.

The imprinting substrate 1101 may include imprinted uneven patterns 1520, first imprinted planar connection pattern 1530, and second imprinted planar connection pattern 1540, which may all be respectively be complementary in shape to the imprinted uneven patterns 1220, the first imprinted planar connection patterns 1230, and the second imprinted planar connection patterns 1240.

Referring to FIG. 33, the imprinting substrate 1101 may be separated from the imprint substrate 1100.

Figure 34:
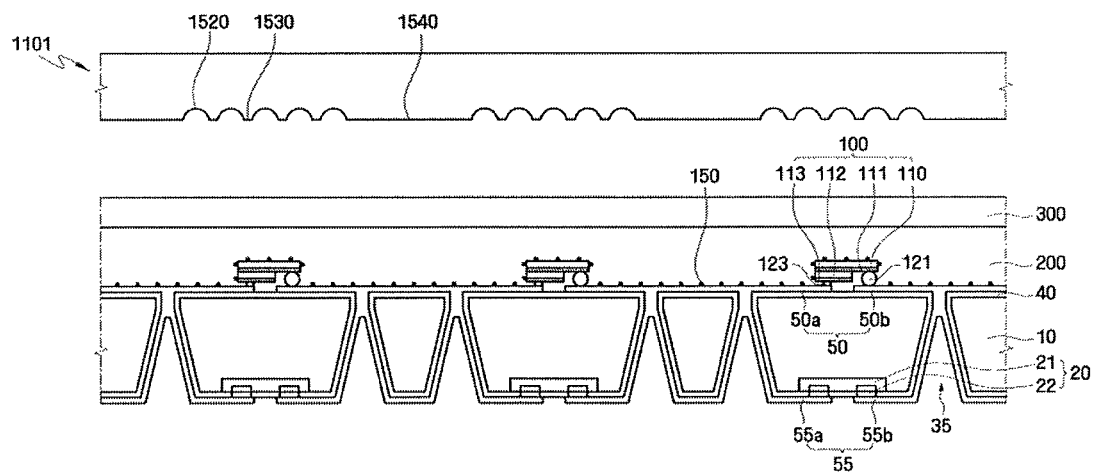
FIGS. 34 and 35 illustrate cross-sectional views sequentially illustrating an exemplary embodiment of a fabricating method of the light-emitting device of FIG. 28.
Figure 35:
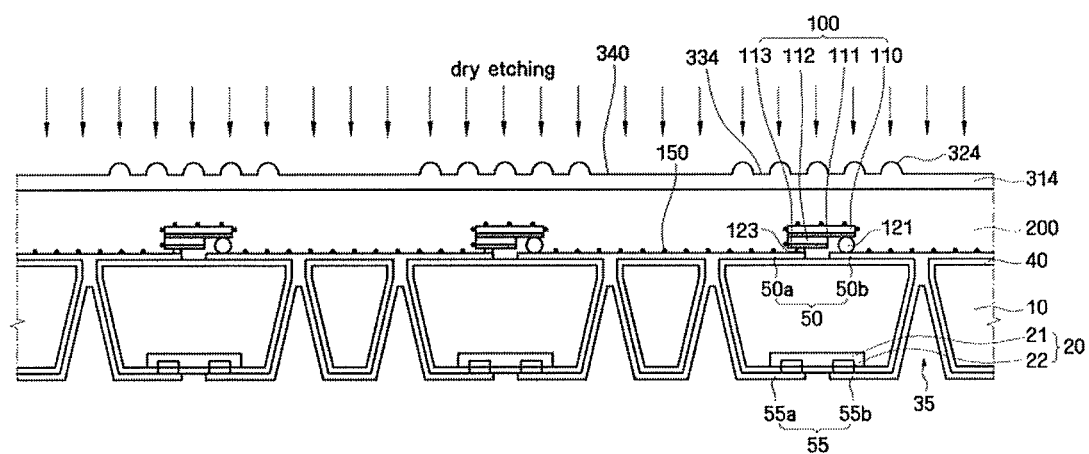

Hereinafter, an exemplary embodiment of a method of fabricating the light-emitting device L9 will be described in detail with reference to FIGS. 11 through 17, and FIGS. 34 and 35. FIGS. 34 and 35 illustrate cross-sectional views sequentially illustrating the exemplary method of fabricating the light-emitting device L9.

First, similar to that described above with regard to FIGS. 11 through 17, the substrate 10 including the light-emitting element 100, the second insulating material 200 covering light-emitting element 100, and the photoresist film 300 covering the second insulating material 200 may be sequentially formed on the first surface 10a of the substrate 10. Embodiments are not limited thereto. For example, the sequence of forming the imprinting substrate 1101 and the substrate 10 may be reversed, i.e., the imprinting substrate 1101 may be formed before processing is initiated on the substrate 10. Further, e.g., the imprinting substrate 1101 and the substrate 10 may be simultaneously formed.

Referring to FIG. 34, the imprinting substrate 1101 may be aligned on the substrate 10 such that the imprinted uneven patterns 1520 and the photoresist film 300 may be opposite to and face each other.

Next, the imprinting substrate 1101 may be compressed on the photoresist film 300 to transcribe a plurality of photoresist uneven patterns (324 of FIG. 35) corresponding to, e.g., complimentary to, the plurality of imprinted uneven patterns 1220 on the photoresist film 300.

Referring to FIGS. 34 and 35, photoresist pattern 314 may be formed on the photoresist film 300. The photoresist pattern 314 may include the plurality of photoresist uneven patterns 324, the first photoresist planar connection patterns 334 connecting the photoresist uneven patterns 324 to each other, and the second photoresist planar connection patterns 340, which may have a same size and complementary shape to the plurality of imprinted uneven patterns 1520, the first imprinted planar connection pattern 1530, and the second imprinted planar connection pattern 1540, respectively. In embodiments in which the imprinted uneven patterns 1520 are concave patterns, the photoresist uneven patterns 324 are formed as convex patterns so as to complementary to the shapes of the imprinted uneven patterns 1520.

Next, the second insulating material 200 may be dry etched using the photoresist patterns 314 as etch masks, resulting in the second insulation film 210'. Since the second insulating material 200 may be etched overall, an overall thickness of the second insulation film 210' may be smaller, compared to the thickness of the second insulating material 200 before etching. Further, as a result of the dry etching, the uneven patterns 224, the first planar connection patterns 234 connecting the uneven patterns 224 to each other, and the second planar connection patterns 240 formed on the isolation regions II, which correspond to the plurality of photoresist uneven patterns 324, the first photoresist planar connection patterns 334 connecting the photoresist uneven patterns 324, and the second photoresist planar connection patterns 340, respectively, are formed on the second insulation film 210. As a result, the plurality of uneven patterns 224 of convex shapes are formed on the second insulation film 210. The plurality of uneven patterns 224 may be formed complementary to the plurality of imprinted uneven patterns 1520.

Figure 36:
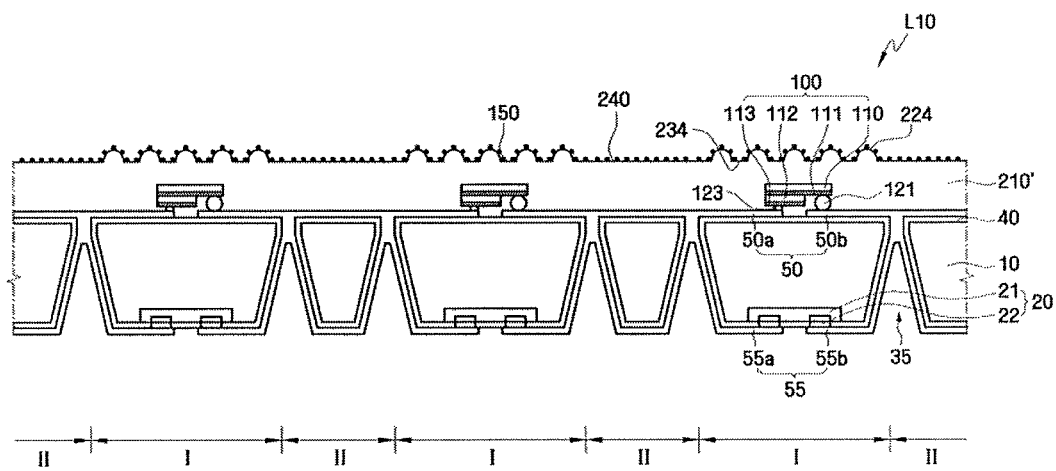
FIG. 36 illustrates a cross-sectional view of another exemplary embodiment of a light-emitting device.

Another exemplary embodiment of a light-emitting device L10 will be described with reference to FIG. 36. FIG. 36 illustrates a cross-sectional view of the light-emitting device L10.

The light-emitting device L10 may substantially correspond to the light-emitting device L5 described above with regard to FIG. 23, except that the uneven patterns 224 are concave and the plurality of uneven patterns 224 are connected to each other by first planar connection patterns 234.

Figure 37:
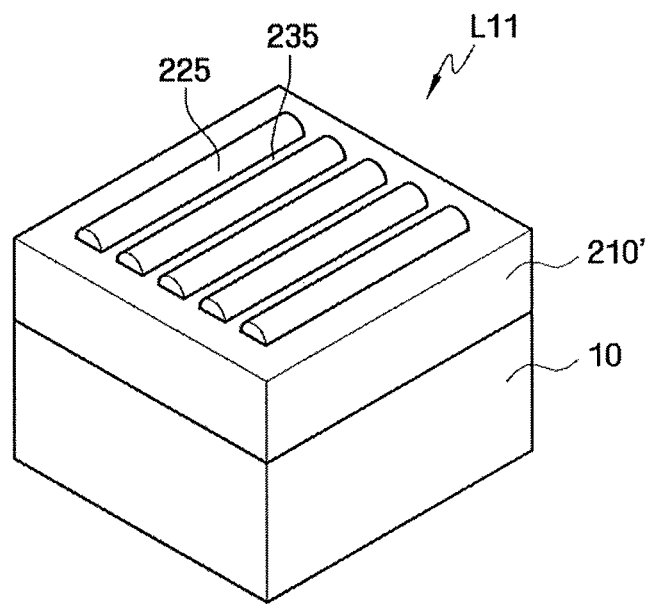
FIG. 37 illustrates a partially enlarged perspective view of another exemplary embodiment of a light-emitting device.

Another exemplary embodiment of a light-emitting device L11 will be described with reference to FIG. 37. FIG. 37 illustrates a partially enlarged perspective view of a portion of the light-emitting device L11.

The light-emitting device L11 is substantially the same as that of the light-emitting device L6 described above with regard to FIGS. 24 and 25, except that the uneven patterns 225 are concave and the plurality of uneven patterns 225 are connected to each other by first planar connection patterns 235.

Figure 38:
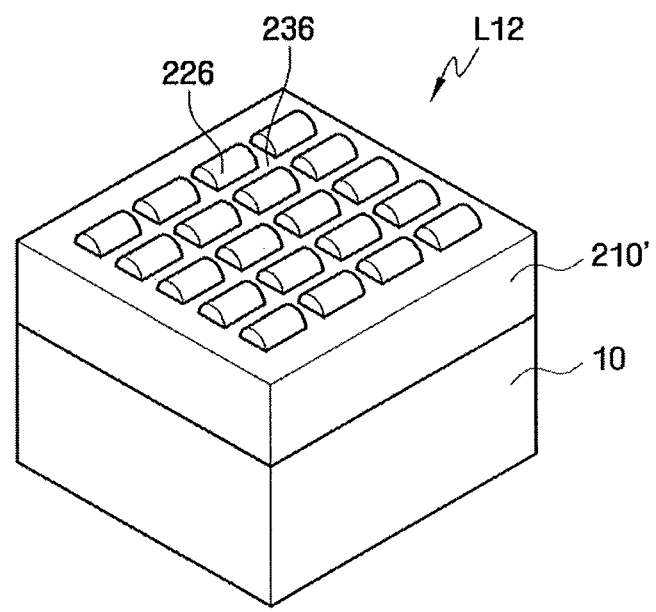
FIG. 38 illustrates a partially enlarged perspective view of another exemplary embodiment of a light-emitting device.

Another exemplary embodiment of a light-emitting device L12 will be described with reference to FIG. 38. FIG. 38 illustrates a partially enlarged perspective view of a portion of the light-emitting device L12.

The light-emitting device L12 substantially corresponds to the light-emitting device L7 described above with regard to FIG. 26, except that the uneven patterns 226 are concave and the plurality of uneven patterns 226 are connected to each other by first planar connection patterns 236.

Figure 39:
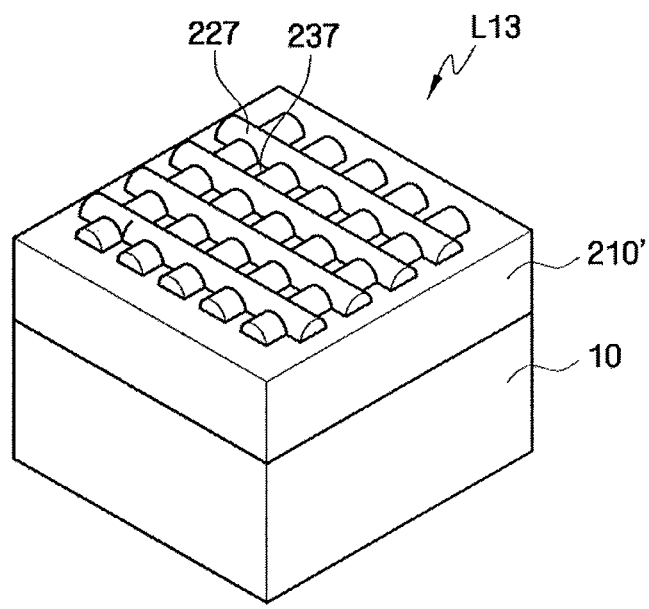
FIG. 39 illustrates a partially enlarged perspective view of another exemplary embodiment of a light-emitting device.

Another exemplary embodiment of a light-emitting device L13 will be described with reference to FIG. 39. FIG. 39 illustrates a partially enlarged perspective view of a portion of the light-emitting device L13.

The light-emitting device L13 is substantially corresponds to the light-emitting device L8 described above with regard to FIG. 27, except that the uneven patterns 227 are concave and the plurality of uneven patterns 227 are connected to each other by first planar connection patterns 237.

FIGS. 40, 41, 42, 43, and 44 illustrate schematic diagrams of exemplary embodiments of light-emitting systems employing a light-emitting device including one or more features described herein, e.g., light-emitting devices L1 through L13.

Figure 40:
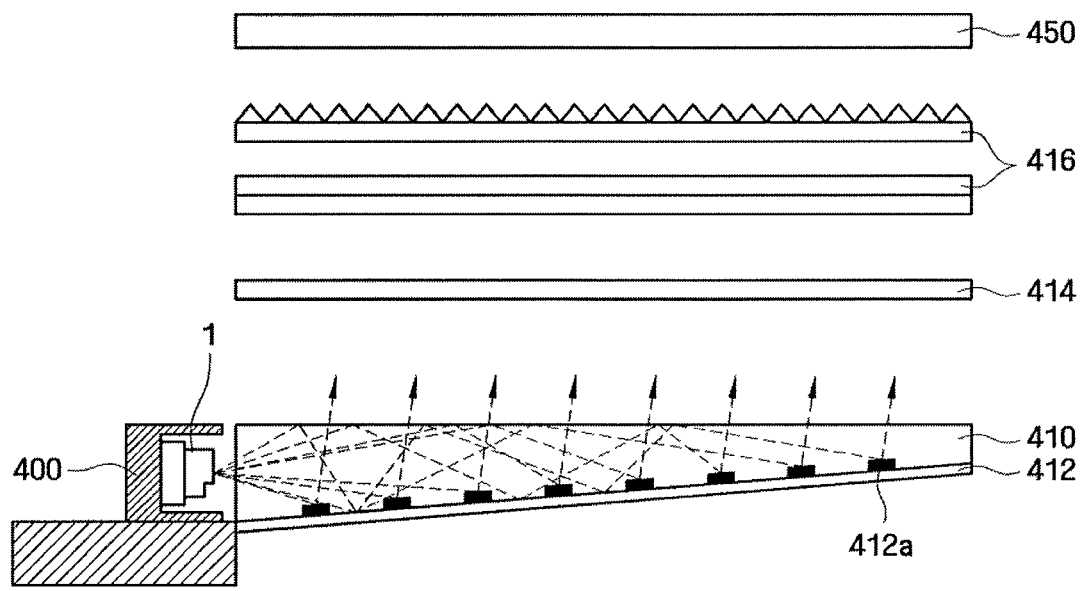
FIGS. 40, 41, 42, 43, and 44 illustrate schematic diagrams of exemplary embodiments of light-emitting systems.

Referring to FIG. 40, light-emitting devices L1 through L13 employing one or more features described herein may be applied to various apparatuses, such as illuminating devices, display devices, and mobile apparatuses (for example, a mobile phone, an MP3 player, and a navigation system). The device shown in FIG. 40 is an edge type backlight unit (BLU) used in a liquid crystal display (LCD). Since the liquid crystal display does not have a light source therein, the backlight unit is used as a light source, and the backlight unit illuminates the rear surface of a liquid crystal panel.

Referring to FIG. 40, the backlight unit includes the light-emitting element 1, a light guide plate 410, a reflecting plate 412, a diffusion sheet 414, a pair of prism sheets 416, and a light source cover 400.

The light-emitting element 1 emits light. The light-emitting element 1 may be of a side view type.

The light guide plate 410 guides light to the liquid crystal panel 450. The light guide plate 410 may include a transparent plastic material, such as an acrylic resin, and guides light emitted from the light-emitting device to the liquid crystal panel 450 that is provided above the light guide plate 410. Therefore, various patterns 412a that change the traveling direction of light incident on the light guide plate 410 to the liquid crystal panel 450 are printed on the rear surface of the light guide plate 410.

The reflecting plate 412 is provided on the lower surface of the light guide plate 410 to reflect light emitted from the lower side of the light guide plate 410 to the upper side. The reflecting plate 412 reflects light that is not reflected by the patterns 412a, which are provided on the rear surface of the light guide plate 410, to the emission surface of the light guide plate 410.

In this way, it is possible to reduce light loss and improve the uniformity of light emitted from the emission surface of the light guide plate 410.

The diffusion sheet 414 diffuses light emitted from the light guide plate 410 to prevent partial light concentration.

Trigonal prisms are formed on the upper surface of the prism sheet 416 in a predetermined array. In general, two prism sheets are arranged such that the prisms deviate from each other at a predetermined angle. In this way, the prism sheets make light diffused by the diffusion sheet 414 travel in a direction that is perpendicular to the liquid crystal panel 450.

Figure 41:
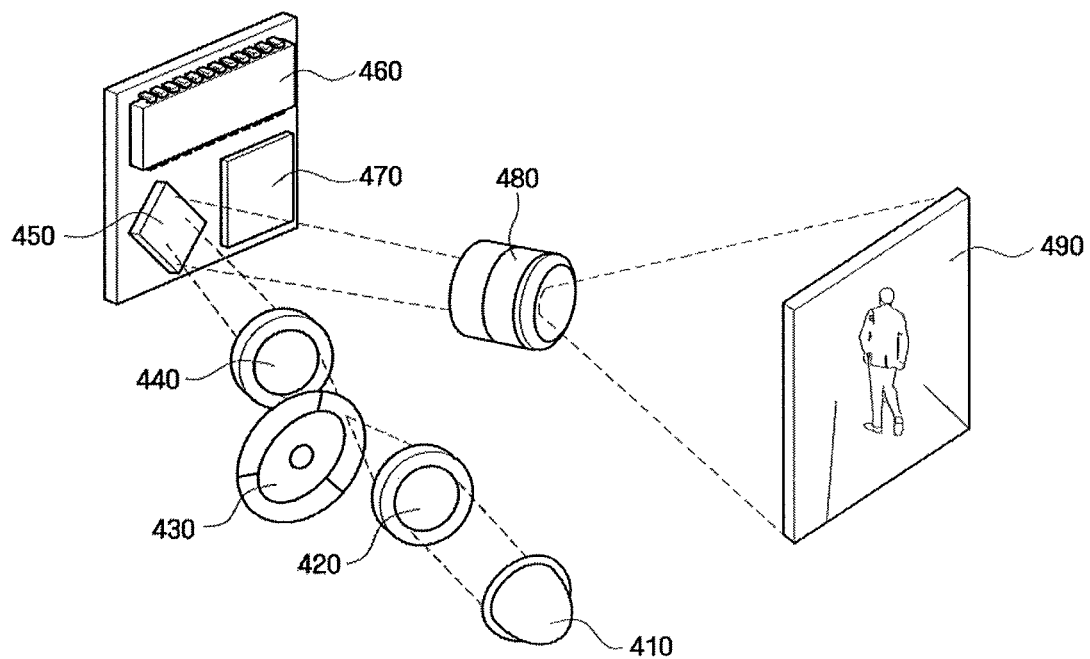
Figure 42:
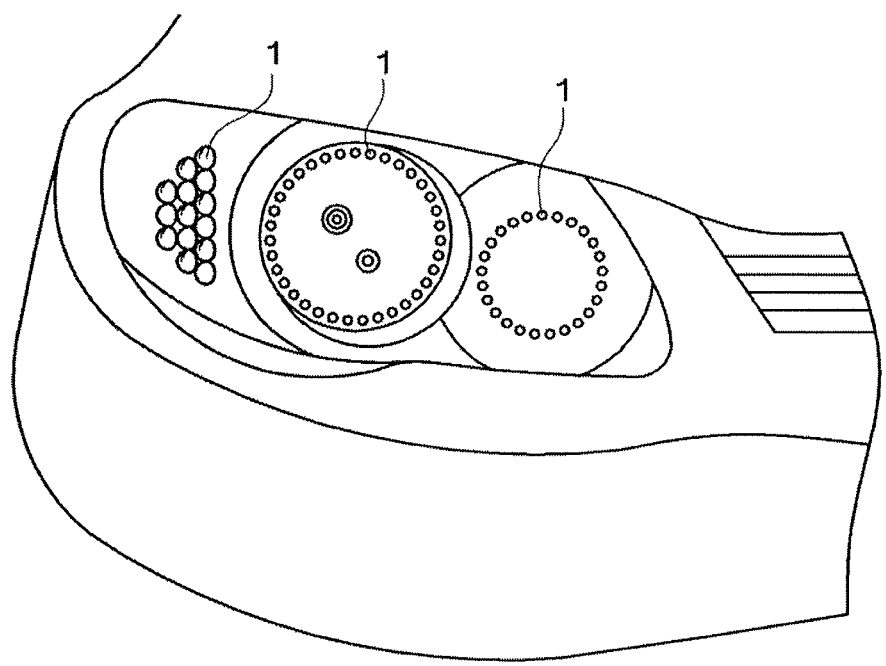
Figure 43:
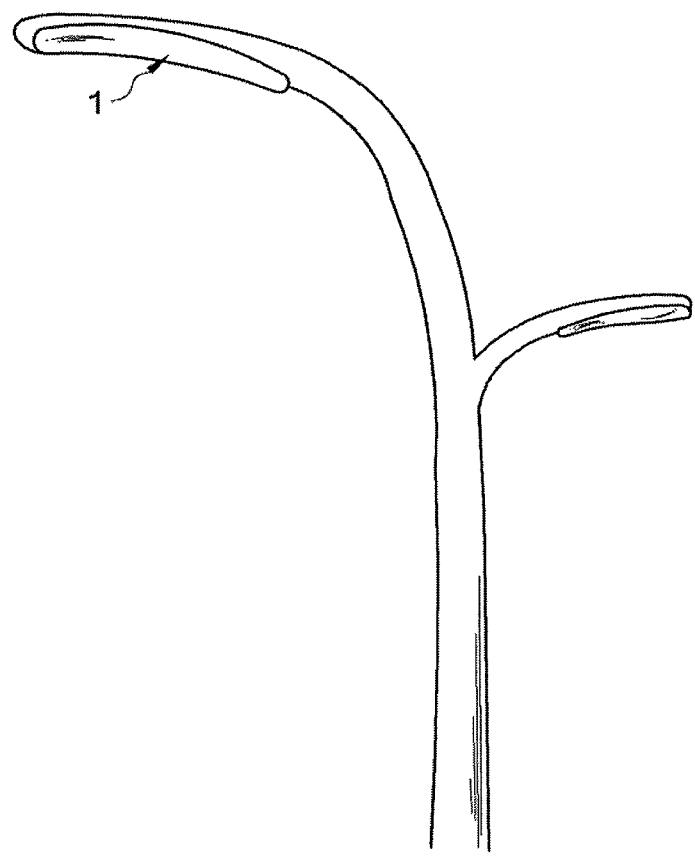
Figure 44:
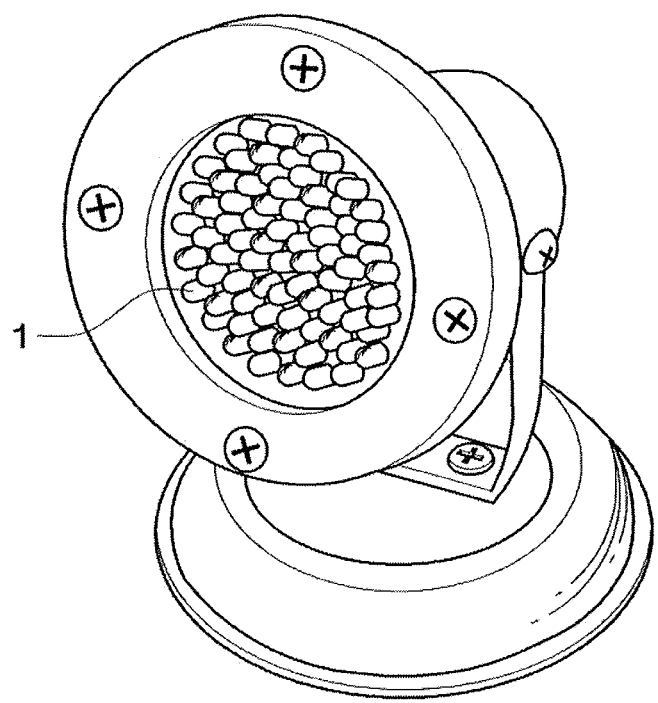

FIGS. 41 to 44 show exemplary embodiments of end products in which the above-mentioned light-emitting devices may be employed. FIG. 41 shows a projector, FIG. 42 shows a car headlight, FIG. 43 shows a streetlamp, and FIG. 44 shows a lamp. The light-emitting element 1 used in FIGS. 42 to 44 may be of a top view type.

A description of the methods of manufacturing the light-emitting systems shown in FIGS. 40 to 44 will be omitted since those skilled in the art can infer the methods from the methods of manufacturing the light-emitting devices according to the previous embodiments of the present invention.

Exemplary embodiments have been disclosed herein, and although specific terms are employed, they are used and are to be interpreted in a generic and descriptive sense only and not for purpose of limitation. Accordingly, it will be understood by those of skill in the art that various changes in form and details may be made without departing from the spirit and scope of the inventive concept as set forth in the following claims.

What is claimed is:

1. A light-emitting device, comprising:
   at least one light-emitting element arranged on a first surface of a substrate;
   an insulation film on the first surface of the substrate, the insulation film covering the at least one light-emitting element; and
   a plurality of uneven patterns on the insulation film, the plurality of uneven patterns respectively overlapping respective ones of the one or more light-emitting elements, the plurality of uneven patterns being spaced apart from each other,
   wherein the plurality of uneven patterns are all convex patterns or all concave patterns,
   wherein the plurality of uneven patterns is on a surface of the insulation film, the surface of the insulation film including:
     a plurality of groups of the uneven patterns, each group including at least two of the uneven patterns, and the groups being spaced apart from each other along a first direction, and
     a first planar connection pattern connecting two adjacent groups of the uneven patterns to each other, each group of the uneven patterns overlapping a different light-emitting element, and the first planar connection being longer along the first direction than a predetermined space between adjacent uneven patterns within a same group,
   wherein each of the uneven patterns is a semicircular cylinder extending along a second direction perpendicular to the first direction, and
   wherein the plurality of the uneven patterns within each group define a stripe pattern in top view.

2. The light-emitting device as claimed in claim 1, wherein the first surface of the substrate is substantially planar as a whole.

3. The light-emitting device as claimed in claim 2, wherein lateral surfaces of the insulation film are exposed.

4. The light-emitting device as claimed in claim 1, wherein a maximum diameter of each of the uneven patterns is in the range of approximately 30 µm to approximately 100 µm.

5. The light-emitting device as claimed in claim 1, wherein a maximum height or depth of each of the uneven patterns is in the range of approximately 30 µm to approximately 50 µm.

6. The light-emitting device as claimed in claim 1, wherein a width of two adjacent spaced-apart uneven patterns of the plurality of uneven patterns is within a range of approximately 5 µm to approximately 20 µm.

7. The light-emitting device as claimed in claim 1, further comprising a phosphor being locally distributed at a lower portion of the insulation film or uniformly distributed on the surface of the insulation film.

8. The light-emitting device as claimed in claim 1, further comprising a zener diode formed on a second surface of the substrate, the second surface being opposite the first surface.

9. A light-emitting device, comprising:
   at least one light-emitting element arranged on a first surface of a substrate;
   an insulation film on the first surface of the substrate, the insulation film covering the at least one light-emitting element; and
   a plurality of uneven patterns on the insulation film,
   wherein each of the light-emitting elements overlaps a respective group of light-controlling patterns, the groups of the light-controlling patterns being spaced apart from each other,
   wherein the plurality of uneven patterns are all convex patterns or all concave patterns, and each of the plurality of uneven patterns has a curved cross-sectional shape,
   wherein the substrate includes a plurality of light-emitting device mount regions and a plurality of isolation regions disposed between two adjacent ones of the plurality of light-emitting device mount regions,
   wherein at least one of the light-emitting elements are disposed for each of the plurality of light-emitting device mount regions, and a plurality of uneven patterns are disposed for each of the plurality of light-emitting device mount regions,
   wherein the plurality of uneven patterns are formed on a surface of the insulation film, the surface of the insulation film disposed on the light-emitting device mount regions includes a plurality of the uneven patterns spaced apart from each other and first planar connection patterns connecting the uneven patterns to each other, and the surface of the insulation film disposed on the plurality of isolation regions includes second planar connection patterns only,
   wherein the second planar connection patterns are grid patterns, and
   wherein a distance between adjacent groups of the light-controlling patterns is longer than a distance between adjacent light-controlling patterns within a group.

10. The light-emitting device as claimed in claim 9, wherein each of the uneven patterns is shaped as a hemisphere or a semicircular cylinder.

11. The light-emitting device as claimed in claim 9, further comprising a one-surface electrode formed on the first surface of the substrate and an opposite-surface electrode formed on second surface of the substrate and connected to the one-surface electrode, and the light-emitting elements are arranged on the one-surface electrode in any one of a flip chip type, a vertical type and a lateral type orientation.

12. The light-emitting device as claimed in claim 9, wherein the insulation film is located on the light-emitting device mount regions only, excluding the isolation regions.

13. The light-emitting device as claimed in claim 10, wherein the plurality of uneven patterns are one of a dot type, a stripe type, and a mesh type.

14. A light-emitting device, comprising:
one or more one light-emitting elements arranged on a first surface of a substrate; and
an insulation film on the first surface of the substrate, the insulation film covering the one or more light-emitting elements and including one or more light-controlling patterns overlapping the one or more light-emitting elements, wherein the light-controlling patterns include all curved-concave patterns or all curved-convex patterns,
wherein each of the light-emitting elements overlaps a respective group of the light-controlling patterns,
wherein each group of the light-controlling patterns includes the one or more light-controlling patterns which are densely disposed in an interior of the group, the groups of the light-controlling patterns being spaced apart from each other, and
wherein each group of the light-controlling patterns is circular.

15. The light-emitting device as claimed in claim 14, wherein, other than the light-controlling patterns, the insulation film is planar.

16. The light-emitting device as claimed in claim 14, wherein the insulation film is planar between the groups of the light-controlling patterns.

17. The light-emitting device as claimed in claim 14, wherein for each of the light emitting elements, each of the groups of light-controlling patterns includes a plurality of the curved-concave patterns or a plurality of the curved-convex patterns, and the respective ones of the plurality of curved-concave or curved-convex patterns within each group are spaced apart from each other.

18. The light-emitting device as claimed in claim 17, wherein the insulation film is planar between each of the plurality of curved-concave or curved-convex patterns in each of the groups of the light-controlling patterns.

19. The light-emitting device as claimed in claim 14, wherein the substrate is planar.

20. The light-emitting device as claimed in claim 19, wherein the substrate includes via holes and/or grooves extending partially and/or completely between the first surface of the substrate and a second surface of the substrate, opposite the first surface.

* * * * *